(12) United States Patent
Takamaru

(10) Patent No.: US 9,679,954 B2
(45) Date of Patent: Jun. 13, 2017

(54) ELECTROLUMINESCENT SUBSTRATE, METHOD FOR PRODUCING SAME, ELECTROLUMINESCENT DISPLAY PANEL, AND ELECTROLUMINESCENT DISPLAY DEVICE

(71) Applicant: Sharp Kabushiki Kaisha, Osaka (JP)

(72) Inventor: Yutaka Takamaru, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 105 days.

(21) Appl. No.: 14/439,638

(22) PCT Filed: Oct. 24, 2013

(86) PCT No.: PCT/JP2013/078769
§ 371 (c)(1),
(2) Date: Apr. 29, 2015

(87) PCT Pub. No.: WO2014/069316
PCT Pub. Date: May 8, 2014

(65) Prior Publication Data
US 2015/0279916 A1   Oct. 1, 2015

(30) Foreign Application Priority Data

Oct. 31, 2012   (JP) .................. 2012-240776

(51) Int. Cl.
*H01L 29/08*   (2006.01)
*H01L 27/32*   (2006.01)
(Continued)

(52) U.S. Cl.
CPC ........ *H01L 27/3262* (2013.01); *H01L 27/124* (2013.01); *H01L 27/1225* (2013.01); *H01L 27/1255* (2013.01); *H01L 27/3248* (2013.01); *H01L 27/3258* (2013.01); *H01L 27/3265* (2013.01); *H01L 28/75* (2013.01); *H01L 29/45* (2013.01); *H01L 29/4908* (2013.01);
(Continued)

(58) Field of Classification Search
CPC ............. H01L 27/3262; H01L 27/1225; H01L 27/1255; H01L 27/3248; H01L 27/3258; H01L 27/3265; H01L 28/75; H01L 29/45; H01L 51/0018
See application file for complete search history.

(56) References Cited

U.S. PATENT DOCUMENTS

2008/0119018 A1*   5/2008   Toyota ................ H01L 27/1288
                                                        438/164
2010/0109004 A1*   5/2010   Arai .................... H01L 27/1225
                                                        257/43

FOREIGN PATENT DOCUMENTS

JP   2010-282807 A   12/2010

OTHER PUBLICATIONS

PCT International Search Report for PCT/JP2013/078769, mailed Jan. 7, 2014, 4 pages.

* cited by examiner

*Primary Examiner* — Matthew Gordon
(74) *Attorney, Agent, or Firm* — Morrison & Foerster LLP

(57) ABSTRACT

The EL substrate includes semiconductor layers of TFTs, a pixel electrode, and an upper part electrode of a Cs section which are provided on a gate insulating film. The semiconductor layers are covered with a protective film which has openings via which the pixel electrode and the upper part electrode are exposed. The semiconductor layers are an oxide semiconductor layer, and the pixel electrode and the upper part electrode are reduction electrodes of the oxide semiconductor layer.

14 Claims, 18 Drawing Sheets

(51) Int. Cl.
*H01L 29/786* (2006.01)
*H01L 27/12* (2006.01)
*H01L 51/52* (2006.01)
*H01L 51/56* (2006.01)
*H01L 29/66* (2006.01)
*H01L 49/02* (2006.01)
*H01L 29/45* (2006.01)
*H01L 29/49* (2006.01)
*H01L 51/00* (2006.01)

(52) U.S. Cl.
CPC .... *H01L 29/66969* (2013.01); *H01L 29/7869* (2013.01); *H01L 29/78693* (2013.01); *H01L 51/0018* (2013.01); *H01L 51/0023* (2013.01); *H01L 51/5206* (2013.01); *H01L 51/56* (2013.01); *H01L 27/3246* (2013.01); *H01L 2227/323* (2013.01); *H01L 2251/303* (2013.01)

ELECTROLUMINESCENT SUBSTRATE, METHOD FOR PRODUCING SAME, ELECTROLUMINESCENT DISPLAY PANEL, AND ELECTROLUMINESCENT DISPLAY DEVICE

CROSS-REFERENCE TO RELATED APPLICATIONS

This application is a U.S. National Stage application of PCT/JP2013/078769, filed Oct. 24, 2013, which claims the benefit of Japanese application No. 2012-240776, filed Oct. 31, 2012, each of which is hereby incorporated by reference in its entirety.

TECHNICAL FIELD

The present invention relates to (i) an electroluminescent substrate including an electroluminescent element, a capacitor section, and a transistor which is electrically connected with the electroluminescent element and the capacitor section, (ii) a method for producing the electroluminescent substrate, (iii) an electroluminescent display panel including the electroluminescent substrate, and (iv) an electroluminescent display device including the electroluminescent substrate.

BACKGROUND ART

In recent years, flat displays are used in various products and fields. For example, an EL (electroluminescent) display panel is known as one of bonding substrates used in such flat displays.

An EL substrate, which is used in an EL (organic EL/inorganic EL) display panel, has a configuration in which a transistor such as a TFT (thin film transistor) is provided on a substrate, and an EL element (organic EL element or inorganic EL element) that is electrically connected with the transistor is further provided on the substrate.

In the EL substrate, (i) a plurality of gate lines and a plurality of source lines for supplying various signals to pixels and (ii) a plurality of driving power source lines are provided. Each of the pixels which is surrounded by the gate line, the source line, and the driving power source line, is provided with a switching transistor, a driving transistor, a Cs (capacitor) section, and the EL element.

Each of the switching transistor, the driving transistor, the Cs section, and the EL element has a multi-layer structure in which each of layers is formed by photolithography with the use of a photomask.

The following description will discuss a method for producing an organic EL substrate as an example of a method for producing an EL substrate.

(a) through (i) of FIG. 18 are cross-sectional views partially and sequentially illustrating processes for producing an organic EL display panel disclosed in Patent Literature 1.

In Patent Literature 1, first, a gate metal 302 is formed as one solid film on an insulating substrate 301 (see (a) of FIG. 18).

Then, the gate metal 302 is patterned with the use of a first photomask so as to form a gate electrode 302G, a signal line 302L, and a lower part electrode of a Cs (capacitor) section (not illustrated) which are made of the gate metal 302 (see (b) of FIG. 18). Then, a gate insulating film 303, a semiconductor layer 304 made of amorphous silicon or polysilicon, and an insulating layer 305 made of silicon nitride or silicon oxide are formed on the insulating substrate 301 as one solid film covering the gate electrode 302G and the signal line 302L.

Next, the insulating layer 305 is patterned with the use of a second photomask so as to form a channel protective film 305a (see (c) of FIG. 18).

Then, an n+ silicon layer 306 is formed as one solid layer on the semiconductor layer 304 so as to cover the channel protective film 305a (see (d) of FIG. 18). Subsequently, a hole is formed in the gate insulating film 303, the semiconductor layer 304, and the n+ silicon layer 306 with the use of a third photomask so that the gate metal 302 is exposed at a location at which a contact hole is to be formed.

After that, a source metal 307 is formed as one solid film (see (e) of FIG. 18). In this case, the gate metal 302 and the source metal 307 are bonded to each other via the hole formed in the gate insulating film 303, the semiconductor layer 304, and the n+ silicon layer 306, and thus a contact hole (not illustrated) is formed.

Then, the source metal 307 is patterned with the use of a fourth photomask so as to form an upper part electrode of the Cs section (not illustrated), a source electrode 307S, a drain electrode 307D, a scanning line (not illustrated), and a driving power source line (not illustrated) (see (f) of FIG. 18).

Moreover, in this case, the semiconductor layer 304 and the n+ silicon layer 306 are patterned with the use of the fourth photomask so as to form (i) a semiconductor film 304a which is made up of the semiconductor layer 304 and (ii) impurity semiconductor films 306a and 306b which are made up of the n+ silicon layer 306.

Next, a conductive film is formed by vapor phase growth and is then patterned with the use of a fifth photomask so as to form a pixel electrode 308 (see (g) of FIG. 18).

Subsequently, a protective film 309 is formed as one solid film which covers the source electrode 307S, the drain electrode 307D, the upper part electrode of the Cs section (not illustrated), the scanning line, the driving power source line, and the pixel electrode 308, and then an opening 309a is formed in the protective film 309 with the use of a sixth photomask so that the pixel electrode 308 is exposed via the opening 309a (see (h) of FIG. 18).

In Patent Literature 1, after that, one solid film of a resin such as a polyimide is applied to an upper part of the protective film 309 and the pixel electrode 308 (see (i) of FIG. 18), and then a netlike insulating film 310 is formed with the use of a seventh photomask. Thus, a partition wall 311 made up of the protective film 309 and the netlike insulating film 310 is formed, and then an organic EL layer (not illustrated) is formed on the pixel electrode 308, and further a counter electrode (not illustrated) is formed on the organic EL layer. Further, a sealing layer is formed by applying a resin (such as an epoxy resin; a thermosetting resin such as an acrylic resin; a thermoplastic resin; or a photo-curable resin) to the counter electrode, and hardening the resin.

As such, in Patent Literature 1, the 6 photomasks are used before the opening 309a is formed in the protective film 309.

CITATION LIST

Patent Literature

[Patent Literature 1]
Japanese Patent Application Publication Tokukai No. 2010-282807 (Publication date: Dec. 16, 2010)

SUMMARY OF INVENTION

Technical Problem

Conventionally, as disclosed in Patent Literature 1, a large number of photomasks have been required for producing an EL substrate used in an EL display panel.

In particular, according to a general method for producing a bottom emission EL substrate as disclosed in Patent Literature 1, many production processes are required, i.e., it is necessary to (i) prepare, as a backplane, a TFT backplane made up of a TFT substrate and (ii) form, on the TFT backplane, a pixel electrode, a luminescent layer, a reflective electrode layer as a counter electrode, and the like.

As such, the conventional method requires many photomasks and many production processes, and it is therefore impossible to produce an EL substrate, an EL display panel, or an EL display device at a low cost. Further, because of the large number of production processes, the conventional method has a problem of a low yield.

Furthermore, the conventional EL substrate has a problem that the conventional EL substrate cannot have a large opening because of the Cs section.

The present invention is accomplished in view of the problems, and its object is to provide (i) an EL substrate, an EL display panel, and an EL display device which can reduce the number of processes and masks for production as compared with a conventional technique, even in a case where a bottom emission type substrate is produced, and (ii) a method for producing such an EL substrate.

A further object of the present invention is to provide (i) an EL substrate, an EL display panel, and an EL display device which can (a) reduce the number of processes and masks for production as compared with a conventional technique, even in a case where a bottom emission type substrate is produced, and (b) improve an aperture ratio while maintaining a sufficient electric charge as compared with the conventional technique, and (ii) a method for producing such an EL substrate.

Solution to Problem

In order to attain the object, an electroluminescent substrate of one aspect of the present invention includes: a gate insulating film; a transistor; an electroluminescent element; a capacitor section; and a protective layer, a semiconductor layer of the transistor, a lower part electrode of the electroluminescent element, and an upper part electrode of the capacitor section being provided on the gate insulating film, and the protective layer being provided over the semiconductor layer, the lower part electrode, and the upper part electrode, the protective layer having an opening through which the lower part electrode and the upper part electrode are exposed, the semiconductor layer being an oxide semiconductor layer, and each of the lower part electrode and the upper part electrode being a reduction electrode which has been made by reducing the oxide semiconductor layer provided on the gate insulating film.

Each of an electroluminescent display panel and an electroluminescent display device of one aspect of the present invention includes the electroluminescent substrate of one aspect of the present invention.

In order to attain the object, a method of one aspect of the present invention for producing an electroluminescent substrate includes the steps of: (A) forming an oxide semiconductor layer on a gate insulating film; (B) shaping the oxide semiconductor layer into a pattern that corresponds to a semiconductor layer of a transistor, a lower part electrode of an electroluminescent element, and an upper part electrode of a capacitor section; (C) forming a protective film over the pattern of the oxide semiconductor layer, the protective film having an opening through which a part of the pattern, which part corresponds to the lower part electrode and the upper part electrode, is exposed; and (D) forming the lower part electrode and the upper part electrode, which are made of a reduction electrode of the oxide semiconductor layer, by reducing the part of the pattern, which part corresponds to the lower part electrode and the upper part electrode, while using the protective film as a mask.

Advantageous Effects of Invention

The oxide semiconductor layer becomes a conductor by being reduced. Moreover, the oxide semiconductor layer thus reduced is transparent and does not absorb light having a wavelength in a visible light range.

Therefore, according to an aspect of the present invention, even in a case where the electroluminescent substrate is a bottom emission type, (i) an ITO layer is not required as a transparent electrode in an electroluminescent element unlike a conventional technique, and (ii) it is possible to simultaneously form the pattern of the semiconductor layer of the transistor, the lower part electrode of the electroluminescent element, and the upper part electrode of the capacitor section with one photomask. This makes it possible to reduce a photomask by one, as compared with the conventional technique.

Moreover, according to an aspect of the present invention, the conductor obtained by reducing a part of the oxide semiconductor layer is used as the transparent electrode as above described, and it is therefore possible to reduce the number of processes in production.

DESCRIPTION OF EMBODIMENTS

The following description will discuss embodiments of the present invention in detail.

Embodiment 1

The following description will discuss the present embodiment with reference to FIGS. 1 through 8.

In the present embodiment, an organic EL display device will be described as an example of an EL (electroluminescence) display device of the present embodiment.

<Schematic Configuration of Organic EL Display Device>

Figure 2:
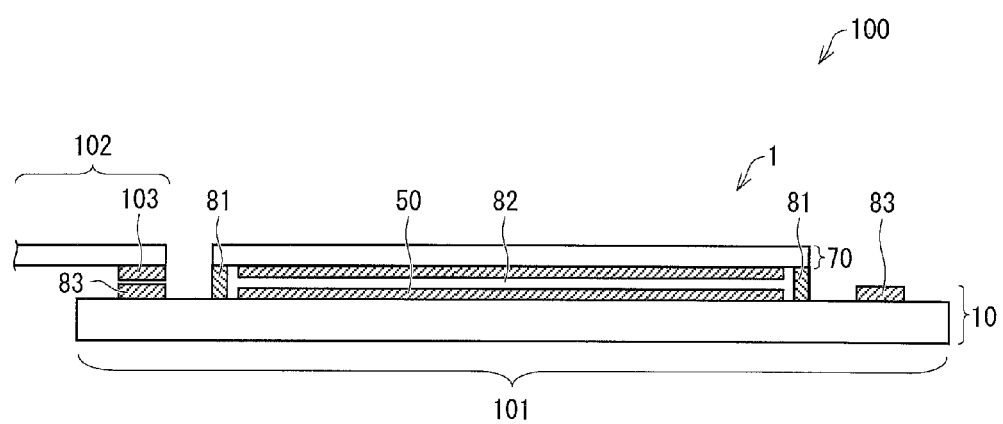
FIG. 2 is a cross-sectional view schematically illustrating a configuration of main parts of an organic EL display device in accordance with one aspect of the present invention.

FIG. 2 is a cross-sectional view schematically illustrating a configuration of main parts of an organic EL display device 100 in accordance with the present embodiment.

As illustrated in FIG. 2, the organic EL display device 100 includes a pixel section 101 and a circuit section 102.

The pixel section 101 is made up of an organic EL display panel 1. The circuit section 102 is made up of members such as a circuit substrate or an IC (Integrated Circuits) chip on which a driving circuit for driving the organic EL display device 100 and the like are provided.

The organic EL display panel 1 includes an element substrate 10 (organic EL substrate, organic EL element substrate) on which an organic EL element 50 is provided, a counter substrate 70, a sealing material 81, and, as needed, a filler 82.

The organic EL element 50 is sealed between the element substrate 10 and the counter substrate 70, which are bonded to each other via the sealing material 81, so as to be protected from moisture, oxygen, external impact, and the like.

Note that the filler 82 is not essentially provided but it is preferable to fill a space between the element substrate 10 and the counter substrate 70 with the filler 82 in order to enhance the protection effect and to maintain a gap between the element substrate 10 and the counter substrate 70.

Moreover, an electrical wiring terminal 83 is provided in a part which is on the element substrate 10 and is on an outer side of a frame-like sealing part made up of the sealing material 81. The electrical wiring terminal 83 is (i) a connection terminal to which a connection terminal 103 of the circuit section 102 is connected and (ii) made of a wiring material such as metal.

In the circuit section 102, for example, a wire such as a flexible film cable and a driving circuit such as a driver are provided. The circuit section 102 is connected with the organic EL display panel 1 via the electrical wiring terminal 83 as illustrated in FIG. 2.

<Schematic Configuration of Element Substrate 10>

Figure 1:
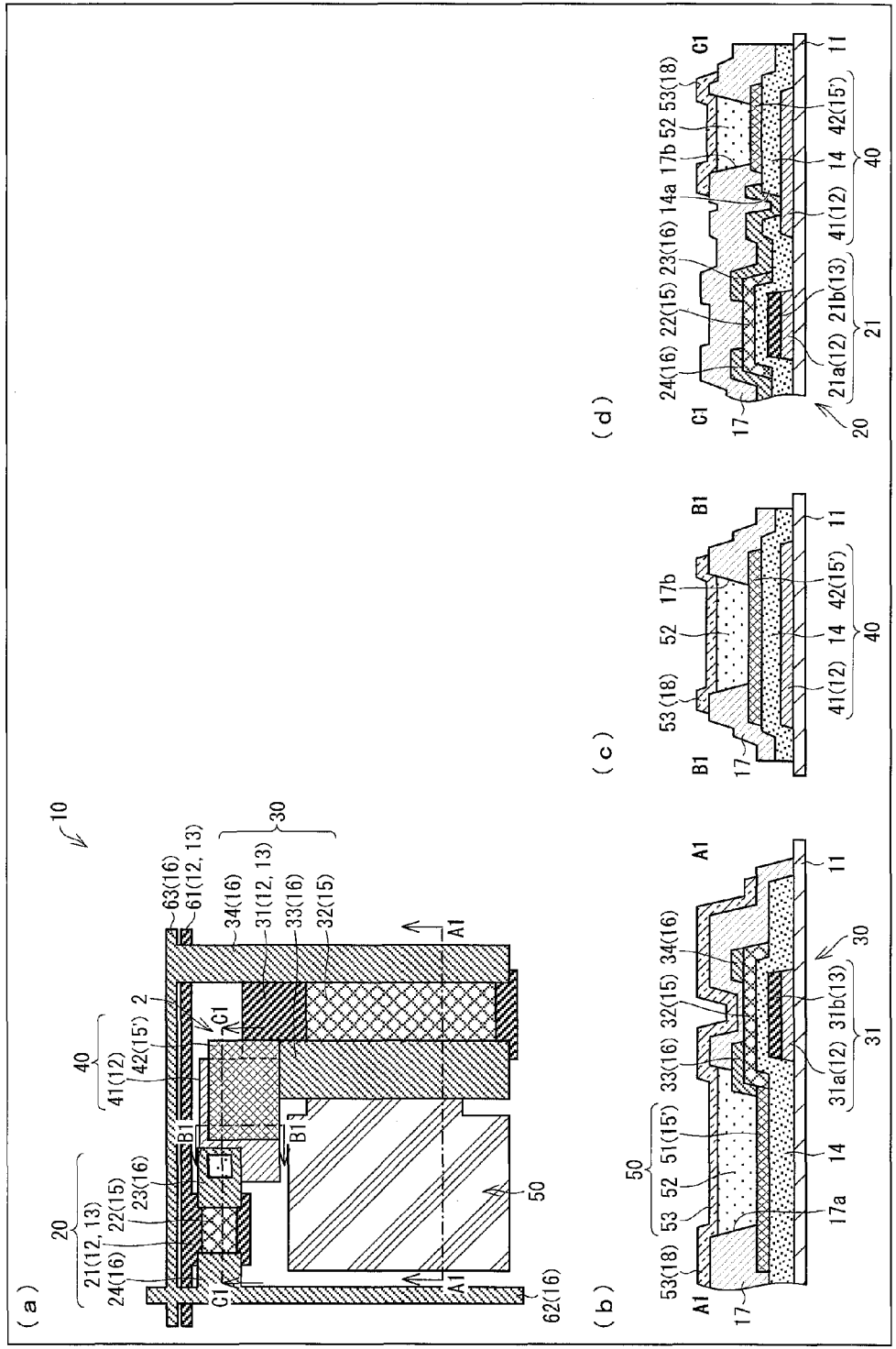
FIG. 1 is a view in which (a) is a plan view schematically illustrating a configuration of one pixel on an element substrate in Embodiment 1, (b) is a cross-sectional view illustrating the element substrate taken along the line A1-A1 in (a), (c) is a cross-sectional view illustrating the element substrate taken along the line B1-B1 in (a), and (d) is a cross-sectional view illustrating the element substrate taken along the line C1-C1 in (a).
Figure 3:
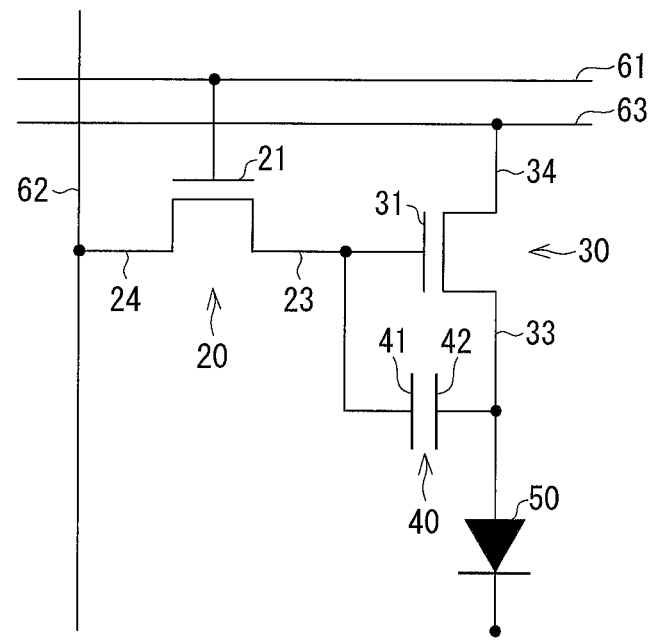
FIG. 3 is an equivalent circuit diagram illustrating one pixel of the element substrate illustrated in (a) through (d) of FIG. 1.

(a) of FIG. 1 is a plan view schematically illustrating a configuration of one pixel on the element substrate 10 in the present embodiment, (b) of FIG. 1 is a cross-sectional view illustrating the element substrate 10 taken along the line A1-A1 in (a) of FIG. 1, (c) of FIG. 1 is a cross-sectional view illustrating the element substrate 10 taken along the line B1-B1 in (a) of FIG. 1, and (d) of FIG. 1 is a cross-sectional view illustrating the element substrate 10 taken along the line C1-C1 in (a) of FIG. 1. Note that, for convenience, some constituent elements are not illustrated in (a) of FIG. 1. FIG. 3 is an equivalent circuit diagram illustrating one pixel of the element substrate 10 illustrated in (a) through (d) of FIG. 1.

(Configuration of Element Substrate 10 in Plan View)

First, the following describes a configuration of the element substrate 10 in a plan view and electrical connection in the element substrate 10, mainly with reference to (a) of FIG. 1 and FIG. 3.

In the organic EL display panel 1, for example, pixels 2 each of which has a color of R (red), G (green), or B (blue) are arranged in a matrix manner with a predetermined pattern.

On the element substrate 10 used in the organic EL display panel 1 having such a configuration, (i) a plurality of gate lines 61 are provided which are arranged in parallel with each other and extend in a row direction, and (ii) a plurality of source lines 62 are provided which are arranged in parallel with each other and extend in a column direction so as to perpendicularly intersect with the plurality of gate lines 61. Moreover, driving power source lines 63 (voltage supplying line) for driving the organic EL element 50 are provided in respective spaces between any adjacent two of the plurality of gate lines 61 so as to extend along the plurality of gate lines 61.

Note that the plurality of gate lines 61 are connected with a gate driver (not illustrated) in the circuit section 102, and the plurality of source lines 62 are connected with a source driver (not illustrated) in the circuit section 102. The driving power source lines 63 are connected with a power source circuit (not illustrated) in the circuit section 102, and a predetermined voltage is supplied from the power source circuit.

One pixel is defined by each of areas which are partitioned in a matrix manner by the plurality of gate lines 61, the plurality of source lines 62, and the driving power source lines 63. In each of the pixels 2, a TFT (thin film transistor) 20 as a switching transistor (first transistor), a TFT 30 as a driving transistor (second transistor), a Cs (capacitor) section 40, and an organic EL element 50 are provided.

(TFT 20)

TFT 20 includes a gate electrode 21, a gate insulating film 14 (first insulating film, see (b) through (d) of FIG. 1), a semiconductor layer 22, a source electrode 23, and a drain electrode 24.

The gate electrode 21 of the TFT 20 is connected with a gate line 61, and one of the source electrode 23 and the drain electrode 24 (hereinafter, the drain electrode 24 but the present embodiment is not limited to this) is connected with a source line 62.

The other of the source electrode 23 and the drain electrode 24 (hereinafter, the source electrode 23 but the present embodiment is not limited to this) is connected with a lower part electrode 41 of the Cs section 40 and is electrically connected with a gate electrode 31 of the TFT 30 via the Cs section 40.

(TFT 30)

The TFT 30 includes a gate electrode 31, a gate insulating film 14, a semiconductor layer 32, a source electrode 33, a drain electrode 34, and the like.

The gate electrode 31 of the TFT 30 is connected with the lower part electrode 41 of the Cs section 40. One of the source electrode 33 and the drain electrode 34 of the TFT 30 (in the present embodiment, the drain electrode 34) is connected with a driving power source line 63. Note that the electrode (hereinafter, the drain electrode 34 but the present embodiment is not limited to this) is formed integrally with the driving power source line 63.

The other of the source electrode 33 and the drain electrode 34 (hereinafter, the source electrode 33 but the present embodiment is not limited to this) is connected with an upper part electrode 42 (second capacitor electrode) of the Cs section 40 and is connected with a pixel electrode 51 of the organic EL element 50 (see (b) of FIG. 1).

(Cs Section 40)

The lower part electrode 41 (first capacitor electrode) and the upper part electrode 42 of the Cs section 40 overlap with each other via the gate insulating film 14. The Cs section 40 forms a capacitor by accumulating an electric charge between the lower part electrode 41 and the upper part electrode 42. The capacitor is provided in order to retain a voltage which is applied to the gate electrode 31 of the TFT 30.

The upper part electrode 42 also serves as a pixel electrode (first electrode, anode) in a luminescent region of the Cs section 40.

(Organic EL Element 50)

The organic EL element 50 is a light-emitting element that can emit light with high luminance by low voltage DC driving. In the organic EL element 50, a pixel electrode 51 (first electrode, lower part electrode of organic EL element, anode), an organic EL layer 52, and a counter electrode 53 (second electrode, upper part electrode of organic EL element, cathode) are stacked in this order (see (b) of FIG. 1).

The organic EL layer 52 can have (i) a single-layer structure including only a luminescent layer or (ii) a multi-layer structure including a hole injection layer, a hole transfer layer, a luminescent layer, an electron transfer layer, an electron injection layer, and the like.

In a case where the pixel electrode 51 is an anode and the counter electrode 53 is a cathode as above described, for example, a hole injection layer, a hole transfer layer, a luminescent layer, an electron transfer layer, an electron injection layer, and the like are stacked, as the organic EL layer 52, in this order from a pixel electrode 51 side, and the counter electrode 53 is provided on the organic EL layer 52.

The pixel electrode 51 injects (supplies) holes to the organic EL layer 52, and the counter electrode 53 injects (supplies) electrons to the organic EL layer 52. Note that the layers between the pixel electrode and the counter electrode are collectively referred to as "organic EL layer".

In the organic EL layer 52, one layer can have two or more functions. For example, the hole injection layer and the hole transfer layer can be separately provided as above described or can be provided as an integrated layer of hole injection layer/hole transfer layer. Similarly, the electron transfer layer and the electron injection layer can be separately provided as above described or can be provided as an integrated layer of electron transfer layer/electron injection layer.

If needed, a carrier blocking layer or the like for blocking a flow of carriers such as holes and electrons can be inserted as appropriate. For example, in a case where a hole blocking layer as the carrier blocking layer is provided between the luminescent layer and the electron transfer layer, it is possible (i) to prevent holes from reaching the electron transfer layer and (ii) to improve light emission efficiency. Similarly, in a case where an electron blocking layer as the carrier blocking layer is provided between the luminescent layer and the hole transfer layer, it is possible to prevent electrons from reaching the hole transfer layer.

Note that the configuration of the organic EL layer 52 is not limited to the above exemplified layer configurations, and it is possible to employ an intended layer configuration depending on requested characteristics of the organic EL element 50.

(Cross Sectional Configuration of Element Substrate 10)

The following description will discuss a cross sectional configuration (i.e., layer configuration) of the element substrate 10.

TFTs 20 and 30 are respective bottom-gate (inversely staggered) TFTs in which the gate electrodes 21 and 31 are located under the respective semiconductor layers 22 and 32.

Note that the TFTs 20 and 30 are simultaneously formed with the use of the same material. Therefore, the TFTs 20 and 30 have a configuration in which, on the insulating substrate 11, gate electrodes (gate electrodes 21 and 31), the gate insulating film 14, semiconductor layers (semiconductor layers 22 and 32), source electrodes (source electrodes 23 and 33), and drain electrodes (drain electrodes 24 and 34) are stacked in this order.

The gate electrode 31 is made up of a transparent conductive layer 31a and a metal layer 31b which is stacked on the transparent conductive layer 31a (see (b) of FIG. 1). The gate electrode 21 is made up of a transparent conductive layer 21a and a metal layer 21b which is stacked on the transparent conductive layer 21a (see (d) of FIG. 1).

The transparent conductive layers 21a and 31a and the metal layers 21b and 31b are formed by patterning the transparent conductive layer 12 and the metal layer 13 which are stacked on the insulating substrate 11, specifically, the transparent conductive layers 21a and 31a are formed by patterning the transparent conductive layer 12, and the metal layers 21b and 31b are formed by patterning the metal layer 13.

In a Cs area in which the Cs section 40 is formed, the lower part electrode 41 is formed by patterning the transparent conductive layer 12 on the insulating substrate 11 (see (c) and (d) of FIG. 1).

As illustrated in (b) through (d) of FIG. 1, the gate electrodes 21 and 31 and the lower part electrode 41 are covered with the gate insulating film 14 (first insulating layer).

Moreover, as illustrated in (b) through (d) of FIG. 1, the semiconductor layer 22 of the TFT 20, the semiconductor layer 32 of the TFT 30, the pixel electrode 51 of the organic EL element 50, and the upper part electrode 42 of the Cs section 40 are provided on the gate insulating film 14.

The semiconductor layers 22 and 32 are semiconductor layers formed by patterning the oxide semiconductor layer 15. The pixel electrode 51 of the organic EL element 50 and the upper part electrode 42 of the Cs section 40 are transparent electrodes (i.e., reduction electrodes of oxide semiconductor layer) made of a reduced oxide semiconductor layer 15' that has been obtained by reducing the patterned oxide semiconductor layer 15.

Examples of the oxide semiconductor encompass InGaZnOx. The oxide semiconductor is preferably amorphous. From these, the oxide semiconductor is preferably made of a-InGaZnOx (i.e., amorphous-InGaZnOx).

As illustrated in (b) of FIG. 1, the semiconductor layer 32 of the TFT 30 and the pixel electrode 51 of the organic EL element 50 which is connected with the TFT 30 are formed integrally by reducing a part of the same semiconductor layer 15 so that the semiconductor layer 15 has two functional regions, i.e., (i) a semiconductor region to be the semiconductor layer 32 and (ii) a reduction region to be the pixel electrode 51.

As illustrated in (d) of FIG. 1, the semiconductor layer 22 of the TFT 20 and the upper part electrode 42 of the Cs section 40 which is connected with the TFT 20 are formed by reducing a part of the same semiconductor layer 15 so that the semiconductor layer 15 has two functional regions, i.e., (i) a semiconductor region to be the semiconductor layer 22 and (ii) a reduction region to be the upper part electrode 42.

The TFTs 20 and 30 of the present embodiment are top contact transistors in which the source electrodes 23 and 33 and the drain electrodes 24 and 34 are provided on the gate insulating film 14 via the semiconductor layers 22 and 32, respectively.

In this configuration, one of the source electrode 33 and the drain electrode 34 (in the present embodiment, the source electrode 33) which is connected with the organic EL element 50 is making contact with an end part on an upper surface of the pixel electrode 51 which is formed integrally with the semiconductor layer 32.

Moreover, one of the source electrode 23 and the drain electrode 24 (in the present embodiment, the source electrode 23) is making contact with an upper surface of the lower part electrode 41 of the Cs section 40 via an opening 14a which is provided in the gate insulating film 14 so as to serve as a contact hole.

An upper part of the TFTs 20 and 30, the gate line 61, the source line 62, and the driving power source line 63 is covered with one protective film (second insulating layer) 17 which has openings 17a and 17b (see (b) and (c) of FIG. 1). The openings 17a and 17b are provided so that pixel electrodes (i.e., the pixel electrode 51 of the organic EL element 50 and the upper part electrode 42 serving as a pixel electrode in the Cs section 40) which are to be used as respective lower part electrodes of the light-emitting section are exposed via the openings 17a and 17b, respectively.

The protective film 17 (i) prevents short-circuiting between the upper part electrode and the lower part electrode between which the organic EL layer is provided and (ii) serves as a partition wall used as an element isolation film. The organic EL layer 52 is provided in the openings 17a and 17b.

On the organic EL layer 52, the counter electrode 53 is provided, as an upper part electrode of the light-emitting section, in locations which respectively correspond to the organic EL element 50 and the Cs section 40. Note that a constant voltage Vcom is applied to the counter electrode 53 (e.g., the counter electrode 53 is grounded).

Note that the transparent conductive layer 12 can be made of, for example, a material such as ITO (indium tin oxide), IZO (indium zinc oxide), gallium-added zinc oxide (GZO), or the like.

Each of the metal layers 13 and 16 can be (i) a single-layer film made of, for example, a metal such as Ni (nickel), Al (aluminum), W (tungsten), TaN (tantalum nitride), or Ti (titanium) or (ii) a multi-layer film including layers of these metals.

Each of the gate insulating film 14 and the protective film 17 can be, for example, a $SiO_2$ (silicon oxide) film, a SiN (silicon nitride) film, or the like.

The counter electrode 53 can be, for example, a reflective electrode which is made of a metal material such as Al, Ag (silver), Mo (molybdenum), or an alloy of Al—Ni (nickel). The counter electrode 53 can be a multi-layer film including a step-covering layer and a resistance-reducing layer as disclosed in, for example, Patent Literature 1.

The step-covering layer is preferably made of a material that has electrical conductivity and a high step coverage property and can be made of, for example, ITO or InZnO (indium oxide doped with zinc).

The resistance-reducing layer (i) is a layer that can reflect light, which has emitted from the luminescent layer toward a cathode side, to an anode side and (ii) can be made of, for example, a material such as an Al—Ni alloy.

Although not illustrated, for example, a sealing film can be provided on the counter electrode 53 in the element substrate 10 so as to cover the counter electrode 53 for preventing external oxygen and moisture from entering the organic EL layer 52. This makes it possible, for example, to protect the organic EL layer 52 from moisture that is to enter via an interface between the element substrate 10 and the sealing material 81.

Note that such a sealing film is a known film as disclosed in Patent Literature 1, and a material of the sealing film is not limited to a particular one. Examples of the sealing film encompass (i) a film made of an inorganic material such as an oxide of Si (silicon) or Al (i.e., oxide such as $SiO_2$, $Al_2O_3$) or a nitride (SiNx, SiCN) and (ii) a film made of an organic material such as acrylate, polyurea, parylene, polyimide, or polyamide.

In the example illustrated in FIG. 2, the EL display panel is formed by bonding the element substrate 10 to the counter substrate 70 which is a sealing substrate. Note, however, that it is possible to use the element substrate 10 as the EL display panel by providing a sealing film on a surface of the element substrate 10 as in Patent Literature 1.

<Schematic Configuration of Counter Substrate 70>

The counter substrate 70 is generally a glass substrate, a plastic substrate, or the like which has a light-transmitting property. The counter substrate 70 can be, for example, a transparent insulating substrate such as a non-alkali glass substrate. Alternatively, the counter substrate 70 can be made of an opaque material such as a metal plate.

<Sealing Material 81 and Filler 82>

The sealing material 81 and the filler 82 can be known sealing material and filler, respectively, which are used in an EL display device.

For example, the sealing material 81 can be a known sealing material (such as (i) an ultraviolet curing resin such as an epoxy resin adhesive agent or (ii) a thermosetting resin) which is used to bond substrates together.

Examples of the filler 82 encompass resins such as an epoxy resin and a silicon resin. The filler 82 can be either adhesive or not, and can contain a desiccant.

<Method for Producing Organic EL Display Panel 1>

The following description will discuss a method for producing the organic EL display panel 1 of the present embodiment. Note that thicknesses, materials, and the like of constituent elements described below merely exemplify an embodiment of the present invention, and therefore should not be construed as limiting the scope of the invention only to them.

First, a method for producing the element substrate 10 is described with reference to FIGS. 4 through 6.

Figure 4:
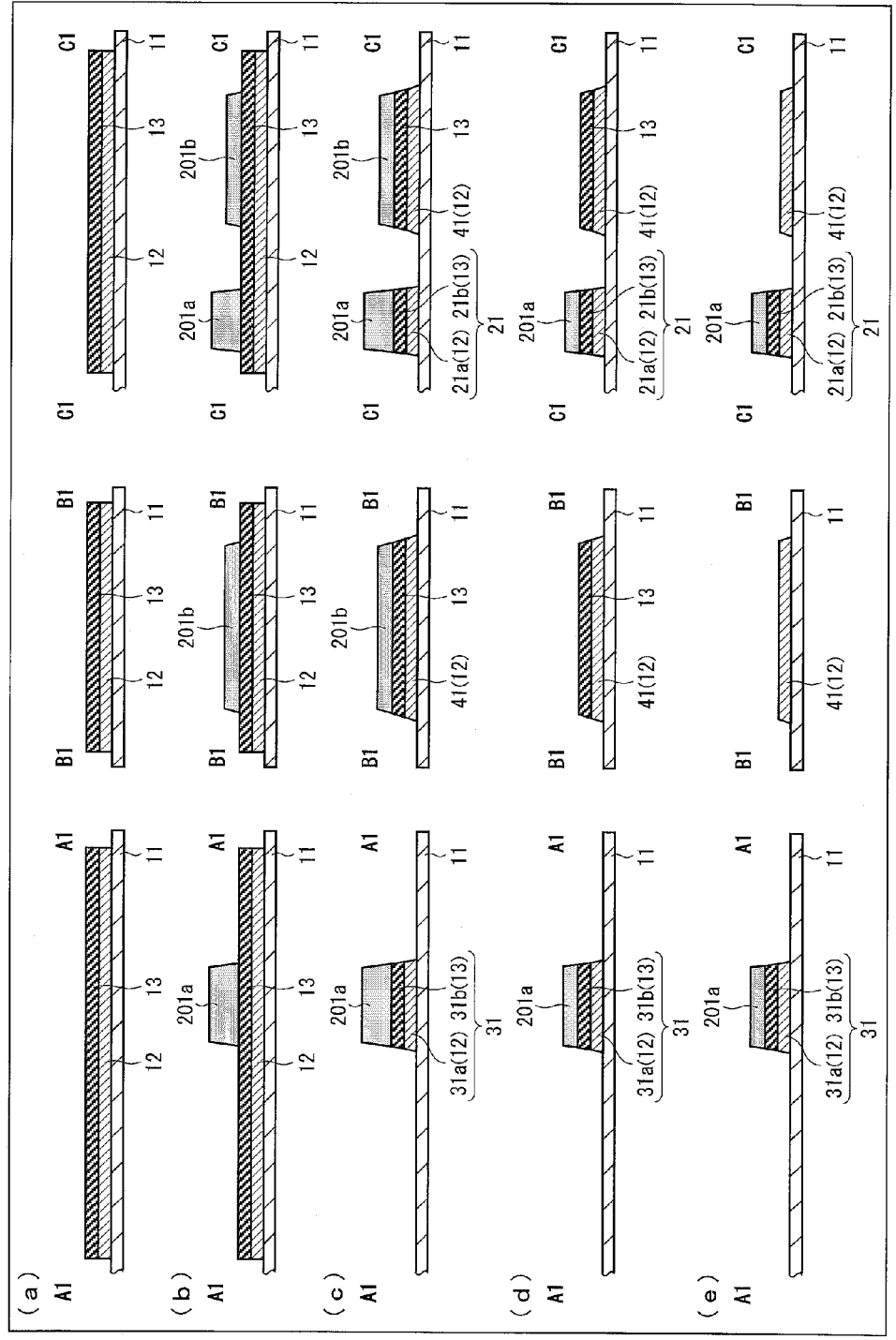
FIG. 4 is a cross-sectional view (i) taken along the lines A1-A1, B1-B1, and C1-C1 in (a) of FIG. 1 and (ii) illustrating an example of processes which are carried out for producing the element substrate sequentially in (a) through (e).
Figure 5:
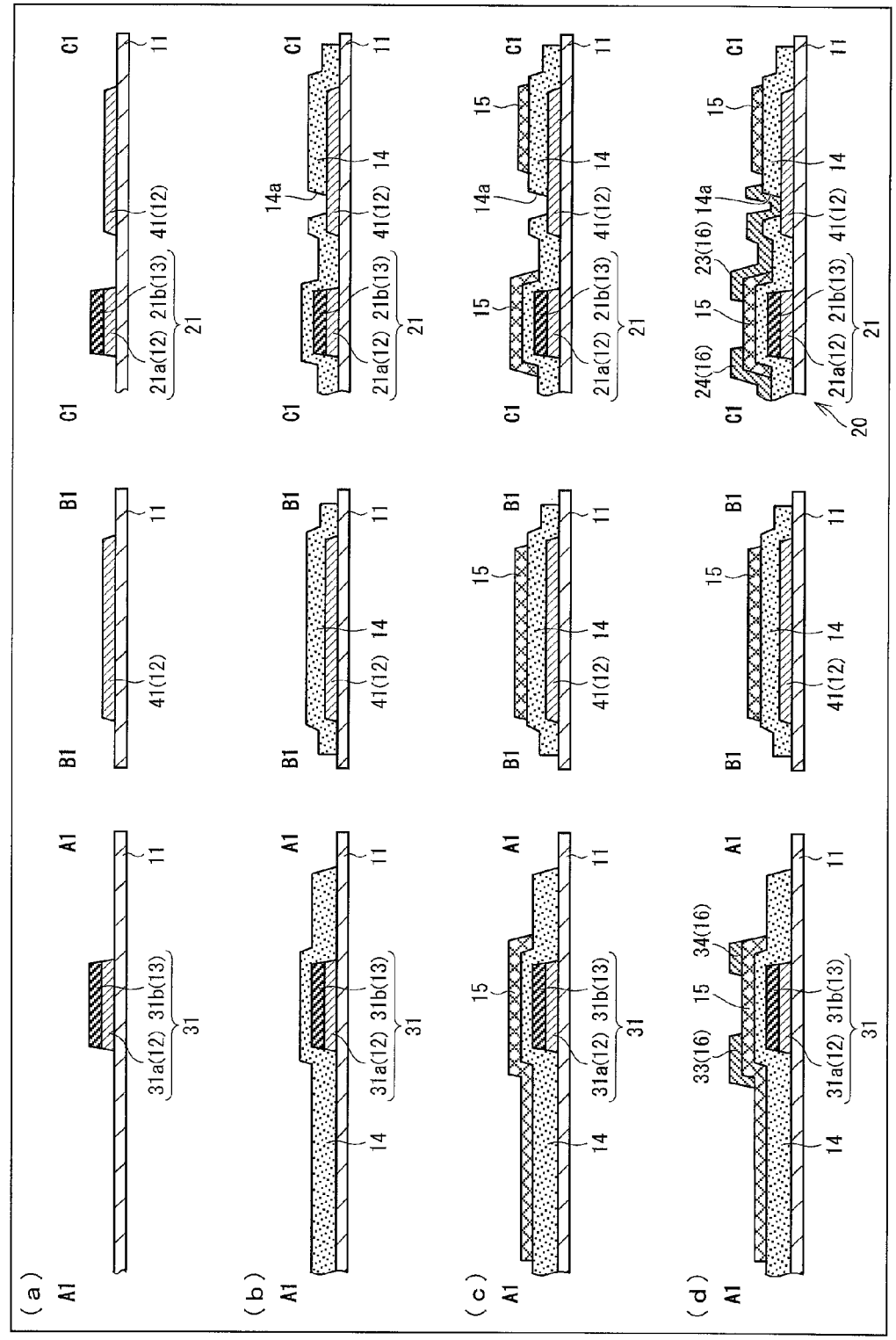
FIG. 5 is a cross-sectional view (i) taken along the lines A1-A1, B1-B1, and C1-C1 in (a) of FIG. 1 and (ii) illustrating an example of processes which are carried out for producing the element substrate sequentially in (a) through (d) after the processes illustrated in (a) through (e) of FIG. 4.
Figure 6:
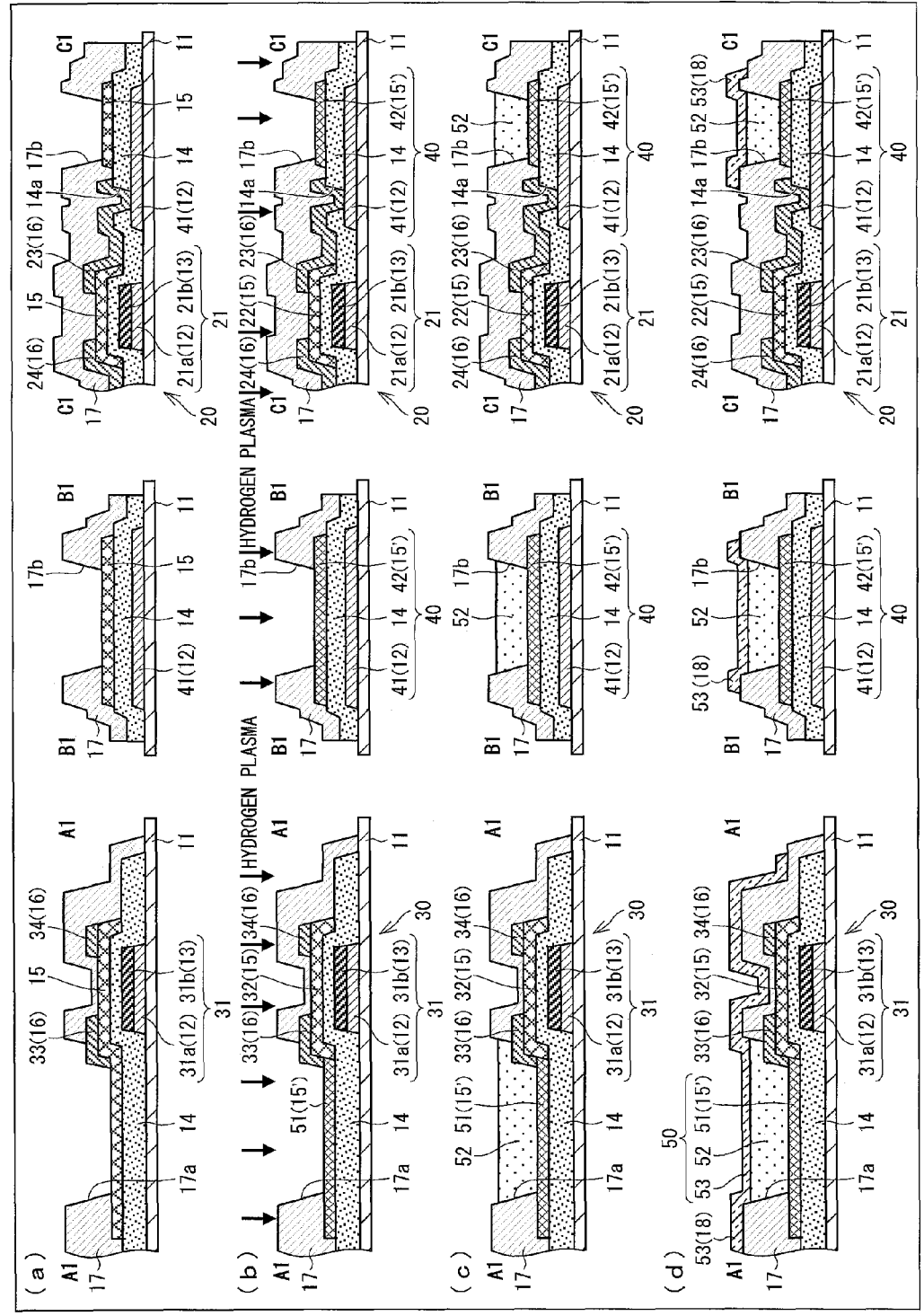
FIG. 6 is a cross-sectional view (i) taken along the lines A1-A1, B1-B1, and C1-C1 in (a) of FIG. 1 and (ii) illustrating an example of processes which are carried out for producing the element substrate sequentially in (a) through (d) after the processes illustrated in (a) through (d) of FIG. 5.

FIGS. 4 through 6 are cross-sectional views taken along the lines A1-A1, B1-B1, and C1-C1 in (a) of FIG. 1 and sequentially illustrate an example of processes in the method for producing the element substrate 10.

Note that, as above described, the TFTs 20 and 30 are simultaneously formed from the same material. Therefore, the gate electrode 21 and the gate electrode 31 are simultaneously formed from the same material with similar methods, the semiconductor layer 22 and the semiconductor layer 32 are simultaneously formed from the same material with similar methods, and the source electrode 23/the drain electrode 24 and the source electrode 33/the drain electrode 34 are simultaneously formed from the same material with similar methods, Hereinafter, for convenience of explanation, an area in which the organic EL element 50 is formed is referred to as "pixel area", an area in which the Cs section 40 is formed is referred to as "Cs area", and an area in which the TFTs 20 and 30 are formed is referred to as "transistor area".

(Step of Forming Gate Electrodes 21 and 31 and Lower Part Electrode 41 of Cs Section 40)

First, on the insulating substrate 11 which is a glass substrate or the like, a transparent conductive layer 12 and a metal layer 13 (gate metal layer, first metal layer), each of which is one solid layer, are stacked in this order (see (a) of FIG. 4).

In the present embodiment, an ITO film having a thickness of 100 nm is deposited as the transparent conductive layer 12, and then TaN (tantalum nitride) and W (tungsten) are deposited in this order with a thickness of W (upper layer)/TaN (lower layer)=370/50 nm as the metal layer 13.

Next, a photoresist is stacked on the metal layer 13, and half-tone exposure is carried out with different light exposures in the transistor area and the Cs area by the use of, as a first photomask, one half-tone mask (not illustrated) which has parts having different light transmittances.

From this, resist patterns 201a and 201b having respectively different thicknesses in the transistor area and the Cs area are formed from the photoresist so that the resist pattern 201a in the transistor area becomes thicker than the resist pattern 201b in the Cs area (see (b) through (d) of FIG. 4).

Subsequently, dry etching is carried out so as to pattern the metal layer 13 while using the resist patterns 201a and 201b as a mask (see (c) of FIG. 4), and then wet etching is carried out so as to pattern the transparent conductive layer 12 while using the resist patterns 201a and 201b and the patterned metal layer 13 as a mask.

The metal layer 13 and the transparent conductive layer 12, which have been patterned in the transistor area, are used as the gate electrodes 21 and 31 and the gate line 61. In the present embodiment, a laminated electrode is formed, which includes the patterned metal layer 13 and the patterned transparent conductive layer 12, as the gate electrodes 21 and 31 and the gate line 61.

Meanwhile, the transparent conductive layer 12 patterned in the Cs area is used as the lower part electrode 41 of the Cs section 40 (i.e., first electrode of Cs section 40).

Note that an etchant used in the wet etching can be a known etchant that is used in wet etching of a transparent conductive film. Examples of the etchant encompass (i) a mixed solution of phosphoric acid, nitric acid, and acetic acid and (ii) oxalic acid. The dry etching can be carried out with the use of a commercially available general dry etching device.

Next, a surface of the resist patterns 201a and 201b is decomposed and removed by ashing (i.e., the surface of the resist patterns 201a and 201b descends). This reduces the thickness of the resist pattern 201a and completely removes the resist pattern 201b as illustrated in (d) of FIG. 4. From this, a surface of the metal layer 13 in the Cs area is exposed.

In the ashing, for example, $O_2$ ashing treatment can be used. Moreover, as a ashing device used in the ashing, it is possible to use a commercially available general ashing device.

Next, the metal layer 13 on the transparent conductive layer 12 in the Cs area is completely removed by dry etching (see (e) of FIG. 4). This allows a surface (i.e., a surface of the lower part electrode 41) of the transparent conductive layer 12 in the Cs area to be exposed.

Subsequently, ashing is carried out again so as to completely remove the remaining resist pattern 201a in the transistor area (see (a) of FIG. 5). This allows a surface (i.e., surfaces of the metal layers 21a and 31a in the pixel electrodes 21 and 31) of the metal layer 13 in the transistor area to be exposed.

(Step of Forming Gate Insulating Film 14)

Next, the gate insulating film 14 (first insulating layer) is deposited so as to cover the metal layer 13 and the transparent conductive layer 12 (see (b) of FIG. 5).

In the present embodiment, a $SiO_2$ (silicon oxide) film and SiN (silicon nitride) film are sequentially deposited, as the gate insulating film 14, by the use of a CVD (chemical vapor deposition) device. In this case, a thickness of the SiO2 film is 50 nm, and a thickness of the SiN film is 325 nm.

Next, (i) the opening 14a serving as a contact hole between the source electrode 23 and the lower part electrode 41 of the Cs section 40, and (ii) an opening (serving as a terminal area of the gate line 61, not illustrated) are formed by photolithography and dry etching with the use of a second photomask.

(Step of Forming Oxide Semiconductor Layer 15)

Next, on the gate insulating film 14, the oxide semiconductor layer 15 is deposited. Note that, in the present embodiment, an a-InGaZnOx layer having a thickness of 50 nm is deposited as the oxide semiconductor layer 15 by the use of a sputtering device.

Subsequently, a photoresist (not illustrated) is stacked on the oxide semiconductor layer 15, and then the oxide semiconductor layer 15 is shaped into an intended pattern by photolithography and wet etching with the use of a third photomask (not illustrated) (see (c) of FIG. 5). Specifically, the oxide semiconductor layer 15 is patterned so as to correspond to a pixel electrode pattern of the organic EL element 50, a semiconductor pattern of the TFTs 20 and 30, and an upper part electrode pattern of the Cs section 40.

In this case, the pixel electrode pattern of the organic EL element 50 is formed integrally with the semiconductor pattern of the TFT 30 which is electrically connected to the organic EL element 50. That is, the pixel electrode pattern of the organic EL element 50 is formed as a part extending from the semiconductor pattern of the TFT 30.

(Step of Forming Source Electrodes 23 and 33 and Drain Electrodes 24 and 34)

Next, a metal layer 16 (source metal layer, second metal layer) is deposited on the gate insulating film 14 so as to cover the semiconductor pattern of the TFTs 20 and 30, and then the metal layer 16 is shaped into an intended pattern by photolithography and dry etching with the use of a fourth photomask (not illustrated) (see (d) of FIG. 5). From this, the source electrodes 23 and 33, the drain electrodes 24 and 34, the source line 62, and the driving power source line 63 are formed from the metal layer 16, and the TFT 20 is formed which includes the source electrode 23 connected with the lower part electrode 41 of the Cs section 40 via the opening 14a.

Note that, in the present embodiment, Ti (titanium), Al (aluminum), and Ti having respective thicknesses of 50 nm, 200 nm, and 100 nm are deposited in this order as the source metal layer by a sputtering device. Thus, the source electrodes 23 and 33, the drain electrodes 24 and 34, the source line 62, and the driving power source line 63 are formed each of which has a three-layer structure of Ti/Al/Ti.

(Step of Forming Protective Film 17)

Next, a protective film 17 (second insulating layer) is deposited on an entire surface of the substrate, and then openings 17a and 17b are formed in the protective film 17 with the use of a fifth photomask (see (a) of FIG. 6). From this, a surface of the oxide semiconductor layer 15 is exposed in a pixel electrode formation region of the organic EL element 50 and in an upper part electrode formation region of the Cs section 40.

Note that, in the present embodiment, a $SiO_2$ film having a thickness of 200 nm is deposited as the protective film 17.

(Step of Reducing Oxide Semiconductor Layer 15)

Next, hydrogen plasma treatment is carried out over the protective film 17 so as to reduce a part of the oxide semiconductor layer 15 which part is not covered with the source electrode 33 and the protective film 17 (see (b) of FIG. 6). From this, a reduced oxide semiconductor layer 15' is obtained which is the oxide semiconductor layer 15 thus reduced.

The oxide semiconductor layer 15 (i.e., the reduced oxide semiconductor layer 15') which has been reduced in the pixel area is used as the pixel electrode 51 of the organic EL element 50. As such, the pixel electrode 51 is formed integrally with the semiconductor layer 32 that is formed from the oxide semiconductor layer 15, and the TFT 30 is formed which includes the source electrode 33 that is directly connected with the pixel electrode 51.

Meanwhile, the oxide semiconductor layer 15 (i.e., the reduced oxide semiconductor layer 15') which has been reduced in the Cs area is used as the upper part electrode 42 of the Cs section 40. As such, the upper part electrode 42 is formed from the reduced oxide semiconductor layer 15' simultaneously with the TFT 30, and the Cs section 40 is formed in which the lower part electrode 41 formed from the transparent conductive layer 12 overlaps with the upper part electrode 42 via the gate insulating film 14.

Note that conditions of the hydrogen plasma treatment are not limited in particular, provided that the hydrogen plasma treatment is carried out such that the oxide semiconductor layer 15 which is exposed in the openings 17a and 17b of the protective film 17 is completely reduced.

In a case where the hydrogen plasma treatment is carried out over the protective film 17 and the source electrode 33 as above described, hydrogen plasma slightly goes into a non-exposed part side of the oxide semiconductor layer 15 via the openings 17a and 17b of the protective film 17 and via an end part of the source electrode 33 exposed from the protective film 17 (see (b) of FIG. 6). As a result, not only the exposed oxide semiconductor layer 15 but also a part of the oxide semiconductor layer 15, which part is not exposed and is in the vicinity of a boundary between the exposed part and the non-exposed part, is reduced by the hydrogen plasma treatment without any other dedicated treatment.

Note that, in a case where the oxide semiconductor layer 15 in the area is not reduced, it is impossible to sufficiently charge a pixel electrode 51, which has been formed from the non-reduced oxide semiconductor layer 15, with a pixel potential, because a contact resistance between the metal layer and the oxide semiconductor layer 15 is high.

The inventors of the present invention have confirmed by an experiment that the pixel electrode 51 can be sufficiently charged with a pixel potential, and also confirmed that the oxide semiconductor layer 15 in the area is reduced without any other dedicated treatment.

Note that (i) the part of the oxide semiconductor layer 15, which part is not exposed but is reduced, is several micrometers or less and (ii) the source electrodes 23 and 33 are respectively formed in an edge part of the opening 17b on a TFT 20 side and in an edge part of the opening 17a on a TFT 30 side. From these, the oxide semiconductor layer 15 in the semiconductor layer formation region of the TFTs 20 and 30 will not be reduced.

(Step of Forming Organic EL Layer 52)

Next, the organic EL layer 52 is formed in the openings 17a and 17b. A method for forming the organic EL layer 52 can be an ink-jet method or can be a method such as a sputtering method or a vacuum vapor deposition method with the use of a mask. Note that, as the method itself for forming the organic EL layer 52, it is possible to use a method similar to a method for producing an organic EL layer of a general organic EL display device.

(Step of Forming Counter Electrode 53)

Next, a conductive layer 18 is stacked on the insulating substrate 11, and the conductive layer 18 is patterned with the use of a sixth photomask (not illustrated) so as to (i) overlap with the pixel electrode 51 of the organic EL element 50 and the upper part electrode 42 of the Cs section 40 via the organic EL layer 52 and (ii) cover the TFTs 20 and 30. Thus, the counter electrode 53 is formed (see (d) of FIG. 6).

Note that, in the present embodiment, Mo (molybdenum) and Al each of which has a thickness of 100 nm are deposited in this order as a conductive layer used as the counter electrode 53.

(Step of Bonding Substrates Together)

Next, as needed, a sealing film is formed so as to cover the counter electrode 53, and then the element substrate 10 thus obtained is bonded to the counter substrate 70 via the sealing material 81. Note that the filler 82 can be applied to any of the element substrate 10 and the counter substrate 70 before the element substrate 10 is bonded to the counter electrode 53 or can be supplied via an inlet after the element substrate 10 and the counter electrode 53 other than the inlet are bonded together.

For bonding the substrates, for example, a vacuum bonding device is used. After the two substrates are thus bonded together, the sealing material 81 is hardened by heat or an ultraviolet ray, and the organic EL display panel 1 illustrated in FIG. 2 is thus produced.

Note that the thicknesses and sizes of the constituent elements on the substrates can be set to intended ones as appropriate depending on a purpose of use and the like, and are not limited in particular. The thicknesses and sizes of the constituent elements can be set, for example, in a manner similar to a conventional manner.

<Effects>

Here, effects of the present invention are described with reference to comparative drawings.

Figure 7:
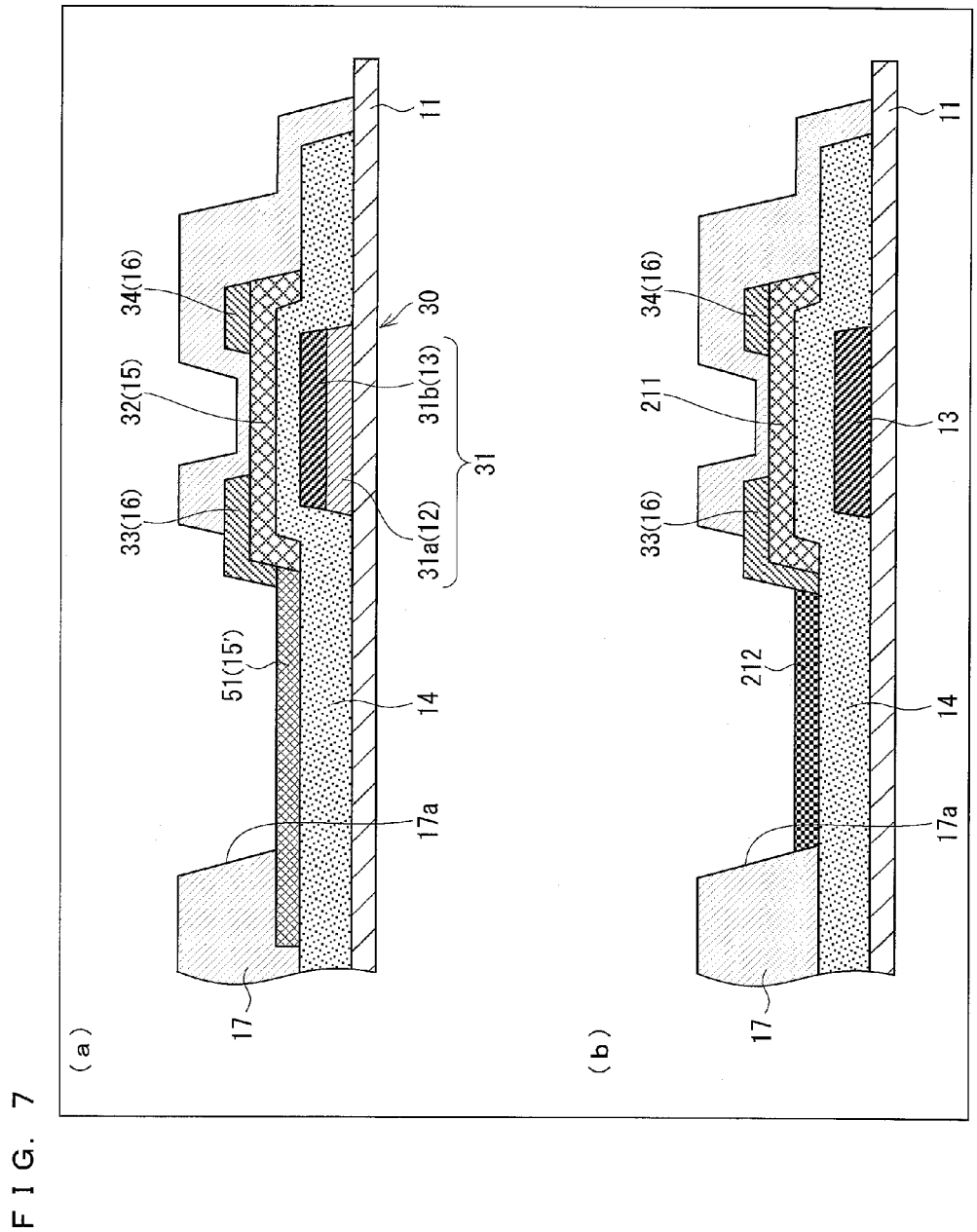
FIG. 7 is a view in which (a) is a cross-sectional view of the element substrate of Embodiment 1 taken along the line A1-A1 and (b) is a cross-sectional view of an element substrate taken along the line A1-A1 in which a pixel electrode has been prepared by using a conventional method when the element substrate is produced.

(a) of FIG. 7 is a cross-sectional view of the element substrate 10 of the present embodiment taken along the line A1-A1, and (b) of FIG. 7 is a cross-sectional view of an element substrate 10 taken along the line A1-A1 in which a pixel electrode has been prepared by using a conventional method when the element substrate 10 is produced. Note that, in (a) and (b) of FIG. 7, the organic EL layer 52 and the counter electrode 53 are not illustrated.

Figure 8:
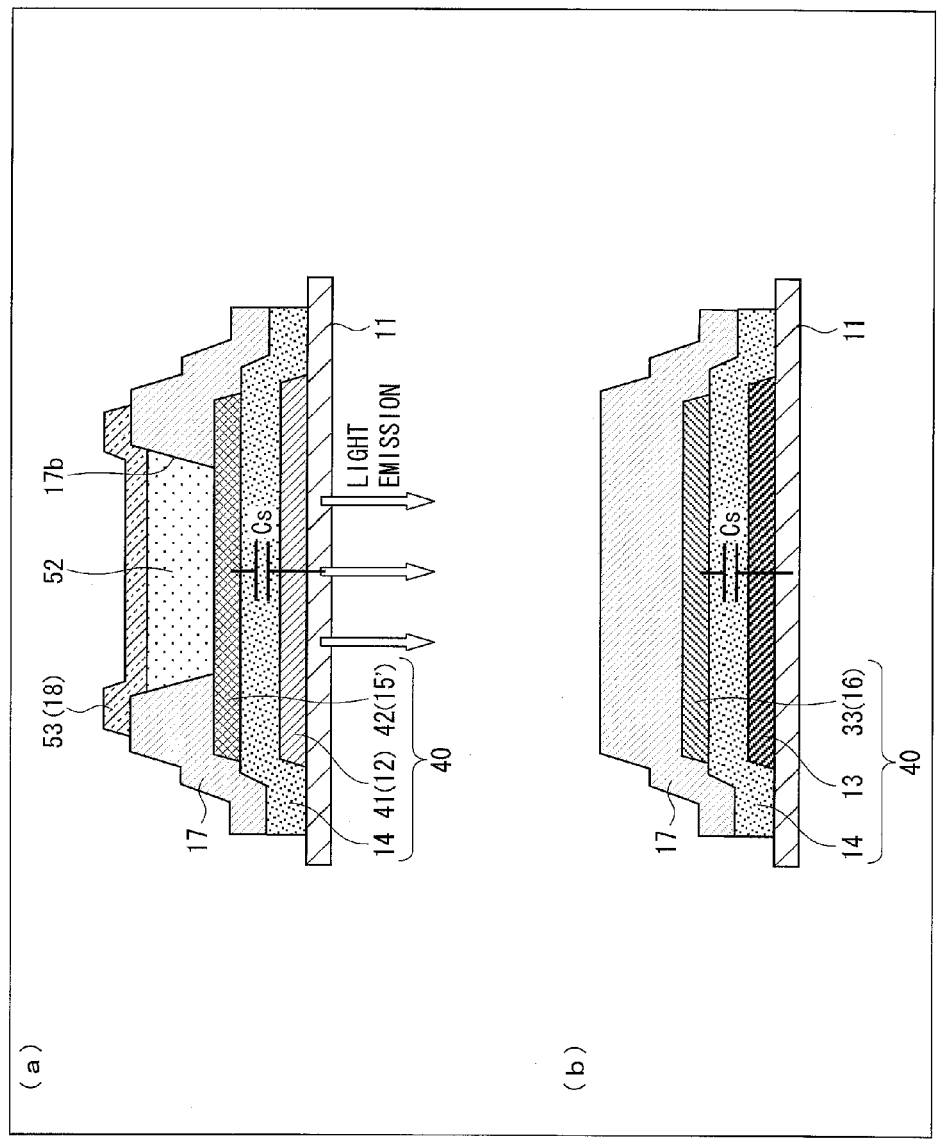
FIG. 8 is a view in which (a) is a cross-sectional view of the element substrate of Embodiment 1 taken along the line B1-B1 and (b) is a cross-sectional view of an element substrate taken along the line B1-B1 in which a Cs section has been prepared by using a conventional method when the element substrate is produced.

(a) of FIG. 8 is a cross-sectional view of the element substrate 10 of the present embodiment taken along the line B1-B1, and (b) of FIG. 8 is a cross-sectional view of an element substrate 10 taken along the line B1-B1 in which a Cs section 40 has been prepared by using a conventional method when the element substrate 10 is produced.

Note that, in (b) of FIG. 7 and (b) of FIG. 8, the same reference numerals are given to constituent elements which have the same functions or are made of the same materials as those of the constituent elements illustrated in (a) through (d) of FIG. 1.

Conventionally, a transparent conductive film which is made of a material such as ITO is generally used as a pixel electrode of a light-emitting section in a bottom emission element substrate, as disclosed in Patent Literature 1. Under the circumstances, in a case where the pixel electrode 212 is prepared by a conventional method when the element substrate 10 is produced, transparent conductive films which are respectively used as the semiconductor layer 211 of the TFT 30 and the pixel electrode 212 are made of different materials and are stacked in different steps, and patterned (see (b) of FIG. 7). From this, it is required to use different photomasks for patterning the semiconductor layer 211 and patterning the pixel electrode 212. That is, one dedicated photomask is required for forming the pixel electrode 212.

On the other hand, in the present embodiment, (i) the oxide semiconductor layer 15 provided on the gate insulating film 14 is shaped into the pattern corresponding to the semiconductor layers 22 and 32 of the respective TFTs 20 and 30, the pixel electrode 51 of the organic EL element 50, and the upper part electrode 42 of the Cs section 40, and (ii) a part of the oxide semiconductor layer 15 is reduced by hydrogen plasma and the like while using the protective film 17 as a mask. It is therefore possible to form the pattern corresponding to the semiconductor layers 22 and 32 of the respective TFTs 20 and 30, the pixel electrode 51 of the organic EL element 50, and the upper part electrode 42 of the Cs section 40 with the use of the one photomask.

The reduced oxide semiconductor layer 15' does not absorb light having a wavelength in a visible light range, and it is therefore possible to use the reduced oxide semiconductor layer 15' as a pixel electrode for bottom emission. This makes it possible to use the reduced oxide semiconductor layer 15' (i) as the pixel electrode 51 which is the lower part electrode of the organic EL element 50 and (ii) as the upper part electrode 42 which serves also as the pixel electrode of the light-emitting section in the Cs section 40 as above described.

As such, according to the present embodiment, (i) an ITO layer is not required for forming the pixel electrode unlike a conventional technique, and (ii) it is possible to simultaneously form the pattern of the semiconductor layer of the TFTs 20 and 30 and the pattern of the pixel electrode 51 with one photomask. This makes it possible to reduce a photomask by one, as compared with the conventional technique.

Moreover, according to the present embodiment, the conductor obtained by reducing a part of the oxide semiconductor layer 15 is used as the transparent electrode (i.e., the pixel electrode 51 and the upper part electrode 42) as above described, and it is therefore possible to reduce the number of processes in production.

The Cs section is generally made of a gate metal and a source metal as disclosed in Patent Literature 1. Specifically, in a case where the Cs section 40 is prepared by a conventional method when the element substrate 10 is produced, the Cs section 40 is formed by the metal layer 13 (first metal layer) and the metal layer 16 (second metal layer) between which the gate insulating film 14 is provided (see (b) of FIG. 8). Therefore, a bottom emission EL display panel is to have an aperture ratio that is disadvantageous as compared with a top emission EL display panel.

On the other hand, according to the present embodiment, as above described, (i) the transparent conductive layer 12 is provided under the metal layer 13 which is the gate metal, (ii) each of the gate electrodes 21 and 31 and the gate line 61 is formed by stacking the transparent conductive layer 12 and the metal layer 13, (iii) the lower part electrode 41 of the Cs section 40 is formed from the transparent conductive layer 12 by half-tone process, and (iv) the upper part electrode 42 of the Cs section 40 is formed by reducing a part of the oxide semiconductor layer 15.

From this, according to the present embodiment, each of the lower part electrode 41 and the upper part electrode 42 of the Cs section 40 is made up of a transparent electrode, and therefore the Cs section 40 allows light to pass through. From this, according to the present embodiment, the upper part electrode 42 of the Cs section 40 can be used as the pixel electrode of the light-emitting section. Therefore, according to the present embodiment, it is possible to form the light-emitting section even on the Cs section 40 by forming the organic EL layer 52 and the counter electrode 53 on the upper part electrode 42 as illustrated in (a) of FIG. 8. This makes it possible to improve an aperture ratio even in the bottom emission type.

Further, according to the present embodiment, as above described, (i) the lower part electrode 41 of the Cs section 40 is made up of the transparent electrode formed from the transparent conductive layer 12 formed simultaneously with the gate electrodes 21 and 31 and (ii) the upper part electrode 42 of the Cs section 40 is made up of the transparent electrode formed by reducing the pattern of the oxide semiconductor layer 15 formed simultaneously with the semiconductor layer pattern of the TFTs 20 and 30. This makes it possible to (i) reduce the number of processes and the number of masks as compared with a conventional technique and (ii) improve an aperture ratio even in the bottom emission type.

Moreover, as above described, the TFT made up of an oxide semiconductor has a greater electric current amount (i.e., higher electron mobility) in an on-state, as compared with a TFT made of a-Si.

Specifically, although not illustrated, the TFT made of a-Si has an Id current (i.e., electric current amount between source and drain of TFT) of 1 μA during its TFT-on period (i.e., period of on-state in accordance with magnitude of on-voltage), whereas the TFT made up of the oxide semiconductor has an Id current of approximately 20 μA to 50 μA during its TFT-on period.

From this, electron mobility during the on-state of the TFT made up of the oxide semiconductor is approximately 20 to 50 times higher than that of the TFT made of a-Si, and thus the TFT made up of the oxide semiconductor has an extremely excellent on-characteristic.

Moreover, although not illustrated, an electric current (i.e., leak current) during an off-state of the TFT made up of the oxide semiconductor is lower than those of the TFT made of a-Si and a TFT made of LTPS (Low Temperature Poly Silicon). Specifically, the TFT made of a-Si has an Id current of 10 pA during its TFT-off period (i.e., period of off-state in accordance with magnitude of on-voltage), whereas the TFT made up of the oxide semiconductor has an Id current of approximately 0.1 pA during its TFT-off period.

From this, a leak current during the off-state of the TFT made up of the oxide semiconductor is approximately 1/100 of the TFT made of a-Si, and thus the TFT made up of the oxide semiconductor (i) hardly causes a leak current and (ii) has an extremely excellent off-characteristic.

According to the organic EL display panel 1 of the present embodiment, the TFTs 20 and 30 each of which is made up of the oxide semiconductor are provided in each of the pixels 2, and the TFTs 20 and 30 have an extremely excellent on-characteristic as above explained. It is therefore possible to reduce a size of the TFTs 20 and 30 in each of the pixels 2.

Embodiment 2

Figure 9:
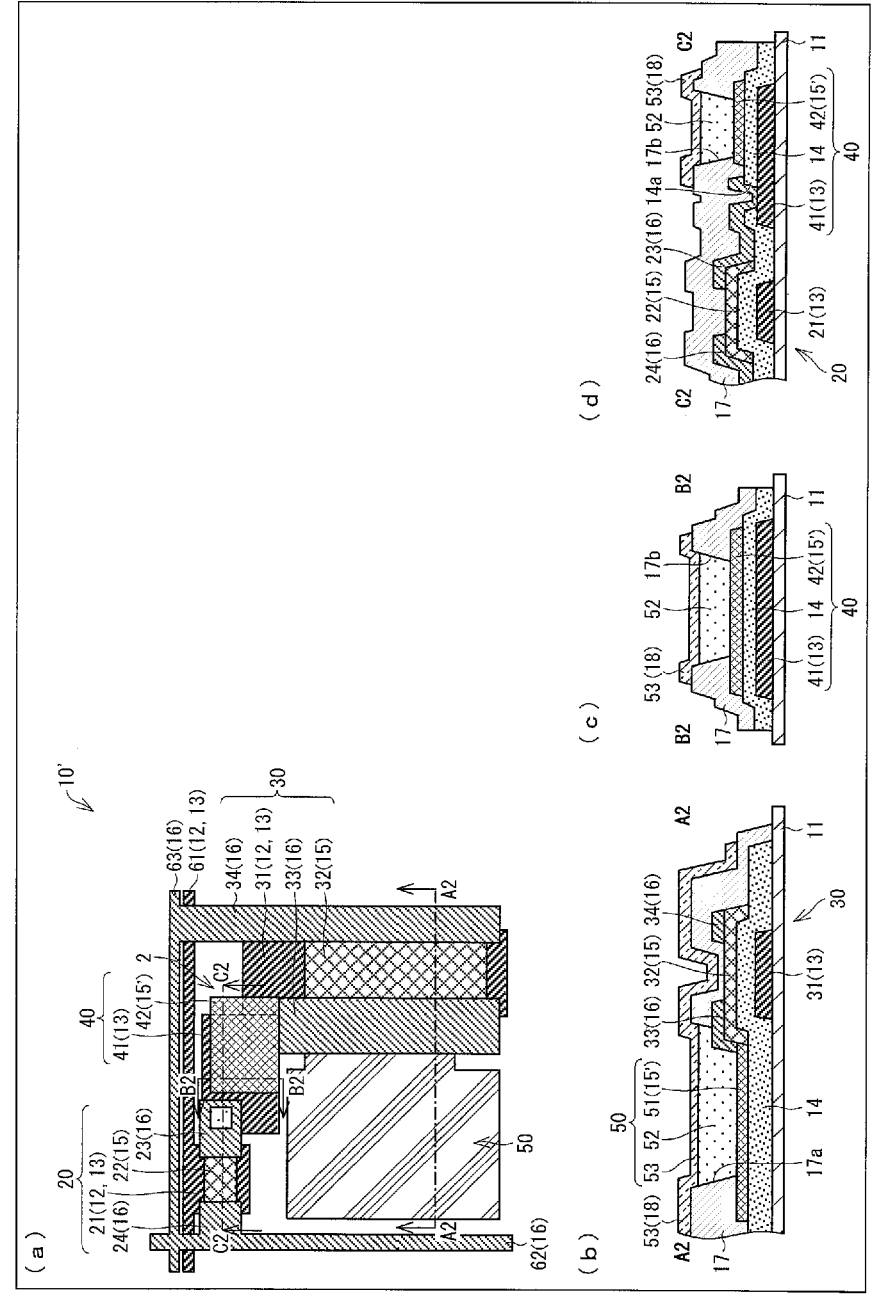
FIG. 9 is a view in which (a) is a plan view schematically illustrating a configuration of one pixel on an element substrate in Embodiment 2, (b) is a cross-sectional view illustrating the element substrate taken along the line A2-A2 in (a), (c) is a cross-sectional view illustrating the element substrate taken along the line B2-B2 in (a), and (d) is a cross-sectional view illustrating the element substrate taken along the line C2-C2 in (a).
Figure 10:
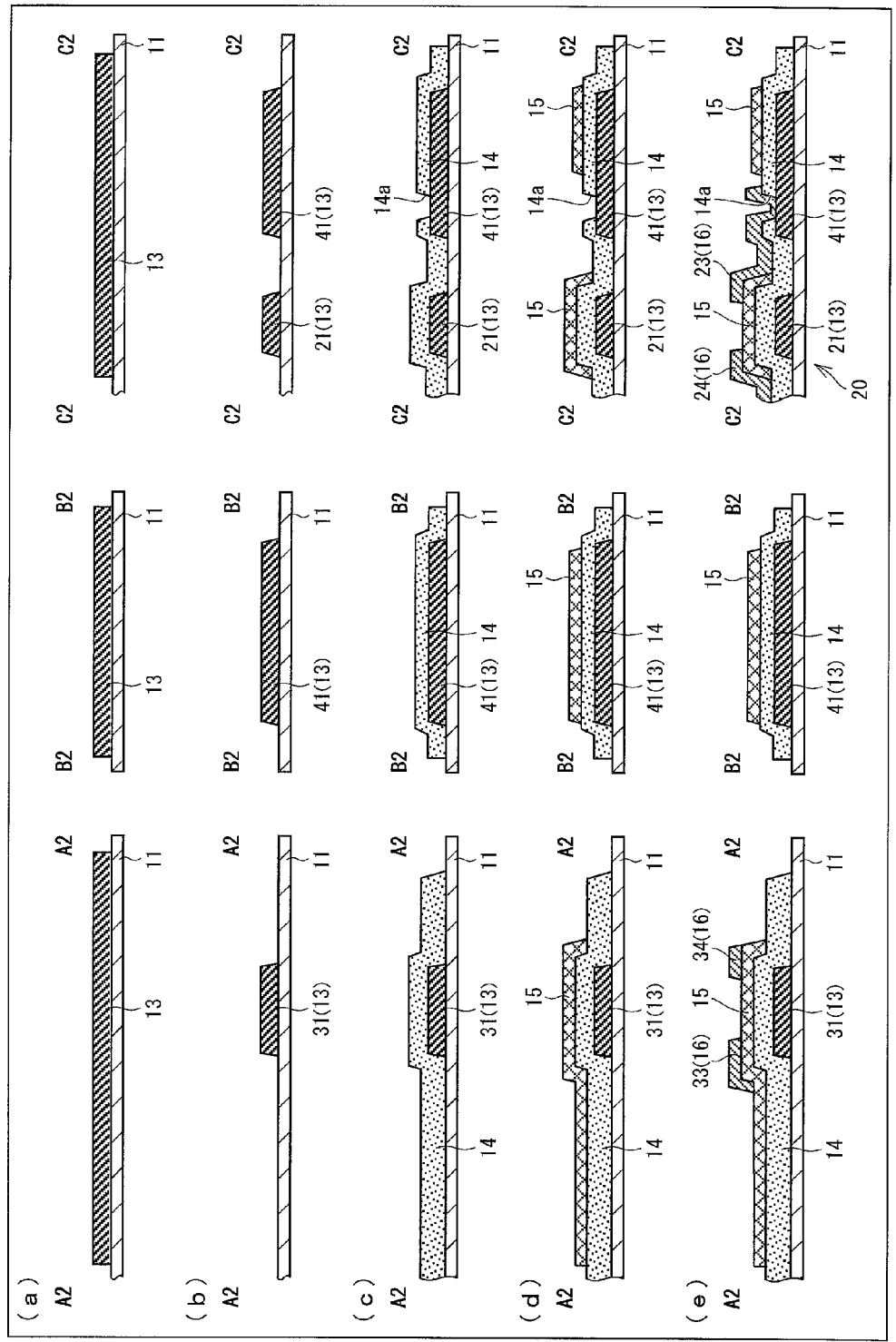
FIG. 10 is a cross-sectional view (i) taken along the lines A2-A2, B2-B2, and C2-C2 in (a) of FIG. 9 and (ii) illustrating an example of processes for producing the element substrate sequentially in (a) through (e).
Figure 11:
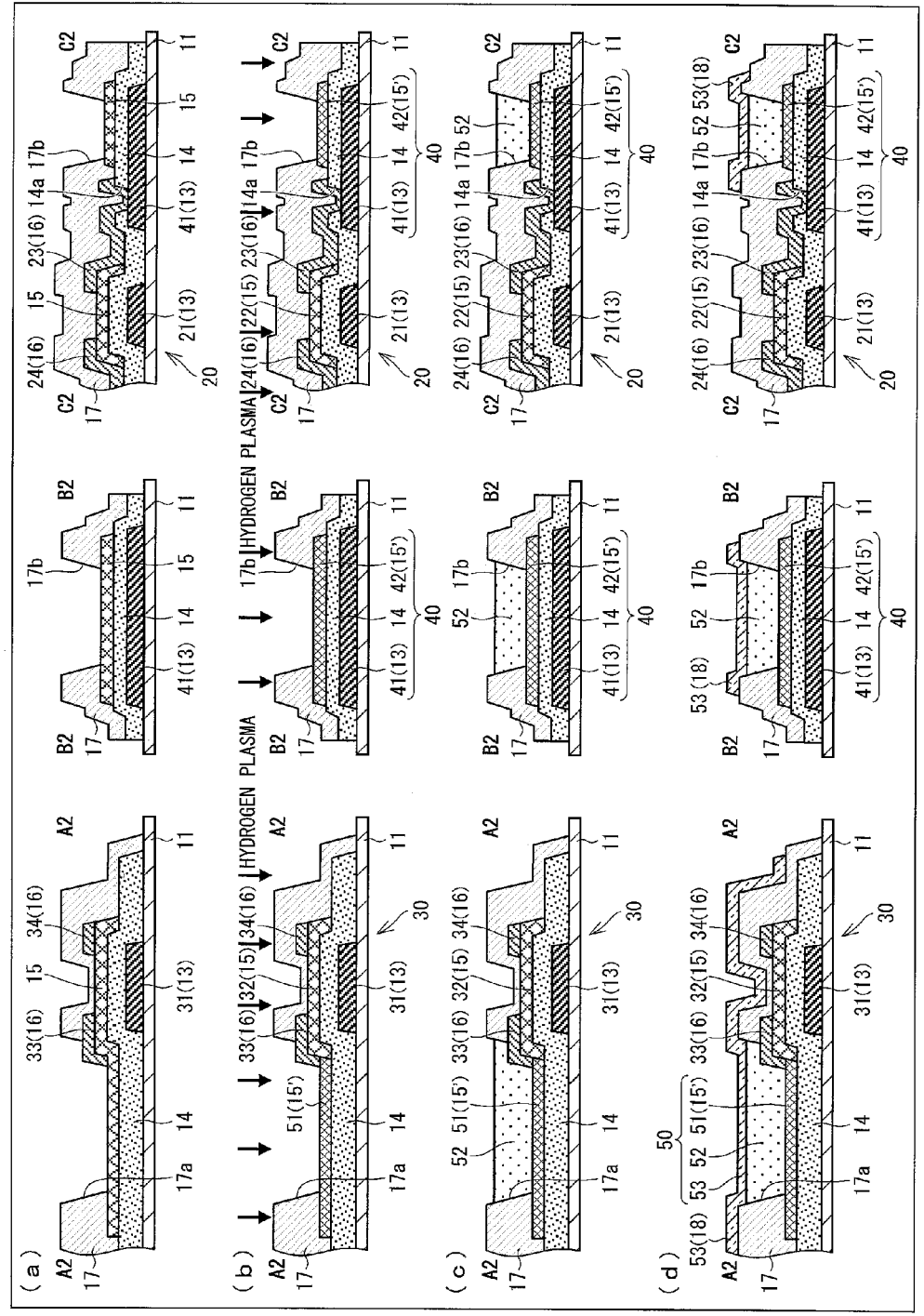
FIG. 11 is a cross-sectional view (i) taken along the lines A2-A2, B2-B2, and C2-C2 in (a) of FIG. 9 and (ii) illustrating an example of processes which are carried out for producing the element substrate sequentially in (a) through (d) after the processes illustrated in (a) through (e) of FIG. 9.

The following description will discuss Embodiment 2 with reference to FIGS. 9 through 11.

Note that, in Embodiment 2, differences from Embodiment 1 are mainly described. The same reference numerals are given to constituent elements having functions identical with those of Embodiment 1, and descriptions of such constituent elements are omitted.

(a) of FIG. 9 is a plan view schematically illustrating a configuration of one pixel on an element substrate 10 in the present embodiment, (b) of FIG. 9 is a cross-sectional view illustrating the element substrate 10 taken along the line A2-A2 in (a) of FIG. 9, (c) of FIG. 9 is a cross-sectional view illustrating the element substrate 10 taken along the line B2-B2 in (a) of FIG. 9, and (d) of FIG. 9 is a cross-sectional view illustrating the element substrate 10 taken along the line C2-C2 in (a) of FIG. 9. Note that, for convenience, some constituent elements are not illustrated also in (a) of FIG. 9, as with (a) of FIG. 1.

An organic EL display device 100 and an organic EL display panel 1 in Embodiment 2 are substantially identical with the organic EL display device 100 and the organic EL display panel 1 of Embodiment 1, respectively, except that (i) gate electrodes 21 and 31 of respective TFTs 20 and 30 and a lower part electrode 41 of a Cs section 40 in an element substrate 10 in Embodiment 2 are formed from a metal layer 13 (i.e., gate metal), and a light-emitting section are not provided on the Cs section 40 (see (a) through (d) of FIG. 9).

<Method for Producing Organic EL Display Panel 1>

The following description will discuss a method for producing the organic EL display panel 1 of the present embodiment with reference to (a) through (e) of FIG. 10 and (a) through (d) of FIG. 11. Note that thicknesses, materials, and the like of constituent elements described below also merely exemplify an embodiment of the present invention, and therefore should not be construed as limiting the scope of the invention only to them.

(a) through (e) of FIG. 10 and (a) through (d) of FIG. 11 are cross-sectional views taken along the lines A2-A2, B2-B2, and C2-C2 in (a) of FIG. 9 and sequentially illustrate an example of processes in the method for producing the element substrate 10. Note that the cross sections taken along the lines A2-A2, B2-B2, and C2-C2 in (a) of FIG. 9 respectively correspond to the cross sections taken along the lines A1-A1, B1-B1, and C1-C1 in (a) of FIG. 1.

(Step of Forming Gate Electrodes 21 and 31 and Lower Part Electrode 41 of Cs Section 40)

First, a metal layer 13 (gate metal layer, first metal layer) is formed as one solid layer on an insulating substrate 11 which is a glass substrate or the like (see (a) of FIG. 10).

In the present embodiment, TaN and W are deposited in this order with a thickness of W (upper layer)/TaN (lower layer)=370/50 nm as the metal layer 13.

Next, a photoresist (not illustrated) is stacked on the metal layer 13, and then the metal layer 13 is patterned by photolithography and dry etching with the use of a first photomask (not illustrated), and thus an electrode pattern formed from the metal layer 13 is obtained (see (b) of FIG. 10). Note that the patterning of the metal layer 13 can be carried out with the use of a dry etching device similar to the dry etching device used in the patterning of the metal layer 13 in Embodiment 1.

The metal layer 13, which has been patterned in the pixel area, is used as gate electrodes 21 and 31 and a gate line 61, as with Embodiment 1.

Meanwhile, the metal layer 13 which has been patterned in the Cs area, is used as a lower part electrode 41 of the Cs section 40 (i.e., first electrode of Cs section 40).

Processes illustrated in (c) through (e) of FIG. 10 and (a) through (d) of FIG. 11 are substantially identical with those of Embodiment 1 illustrated in (b) through (d) of FIG. 5 and (a) through (d) of FIG. 6, except that each of the gate electrodes 21 and 31 and the gate line 61 has a single-layer structure made up of the metal layer 13, and the lower part electrode 41 of the Cs section 40 is formed from the metal layer 13 which has been patterned. Therefore, descriptions of such processes are omitted here.

<Effects>

According to the present embodiment, the lower part electrode 41 of the Cs section 40 is made of the gate metal, and therefore the Cs section 40 does not cause light to pass through. From this, a light-emitting section is not provided in the Cs section 40 as illustrated in (c) and (d) of FIG. 9. Therefore, unlike Embodiment 1, an aperture ratio cannot be improved as compared with a conventional technique, that is, the aperture ratio itself is identical with that of the conventional technique.

However, even in the present embodiment, as with Embodiment 1, (i) the oxide semiconductor layer 15 provided on the gate insulating film 14 is shaped into the pattern corresponding to the semiconductor layers 22 and 32 of the respective TFTs 20 and 30, the pixel electrode 51 of the organic EL element 50, and the upper part electrode 42 of the Cs section 40, and (ii) a part of the oxide semiconductor layer 15 is reduced by hydrogen plasma and the like while using the protective film 17 as a mask. It is therefore possible to form the pattern corresponding to the semiconductor layers 22 and 32 of the respective TFTs 20 and 30, the pixel electrode 51 of the organic EL element 50, and the upper part electrode 42 of the Cs section 40 with the use of the one photomask.

As such, according to the present embodiment also, (i) an ITO layer is not required for forming the pixel electrode unlike a conventional technique, and (ii) it is possible to simultaneously form the pattern of the semiconductor layer of the TFTs 20 and 30 and the pattern of the pixel electrode 51 with one photomask. This makes it possible to reduce a photomask by one, as compared with the conventional technique.

Moreover, according to the present embodiment, the conductor obtained by reducing a part of the oxide semiconductor layer 15 is used as the transparent electrode (i.e., the pixel electrode 51 and the upper part electrode 42) as above described, and it is therefore possible to reduce the number of processes in production.

Moreover, according to the present embodiment, half-tone process is not carried out, and it is therefore possible to simplify the processes for producing the element substrate 10, further, the organic EL display panel 1 and the organic EL display device 100, as compared with Embodiment 1.

Embodiment 3

The following description will discuss Embodiment 3 with reference to FIGS. 12 through 16.

Note that, in Embodiment 3, differences from Embodiment 1 are mainly described. The same reference numerals are given to constituent elements having functions identical with those of Embodiment 1, and descriptions of such constituent elements are omitted.

Figure 12:
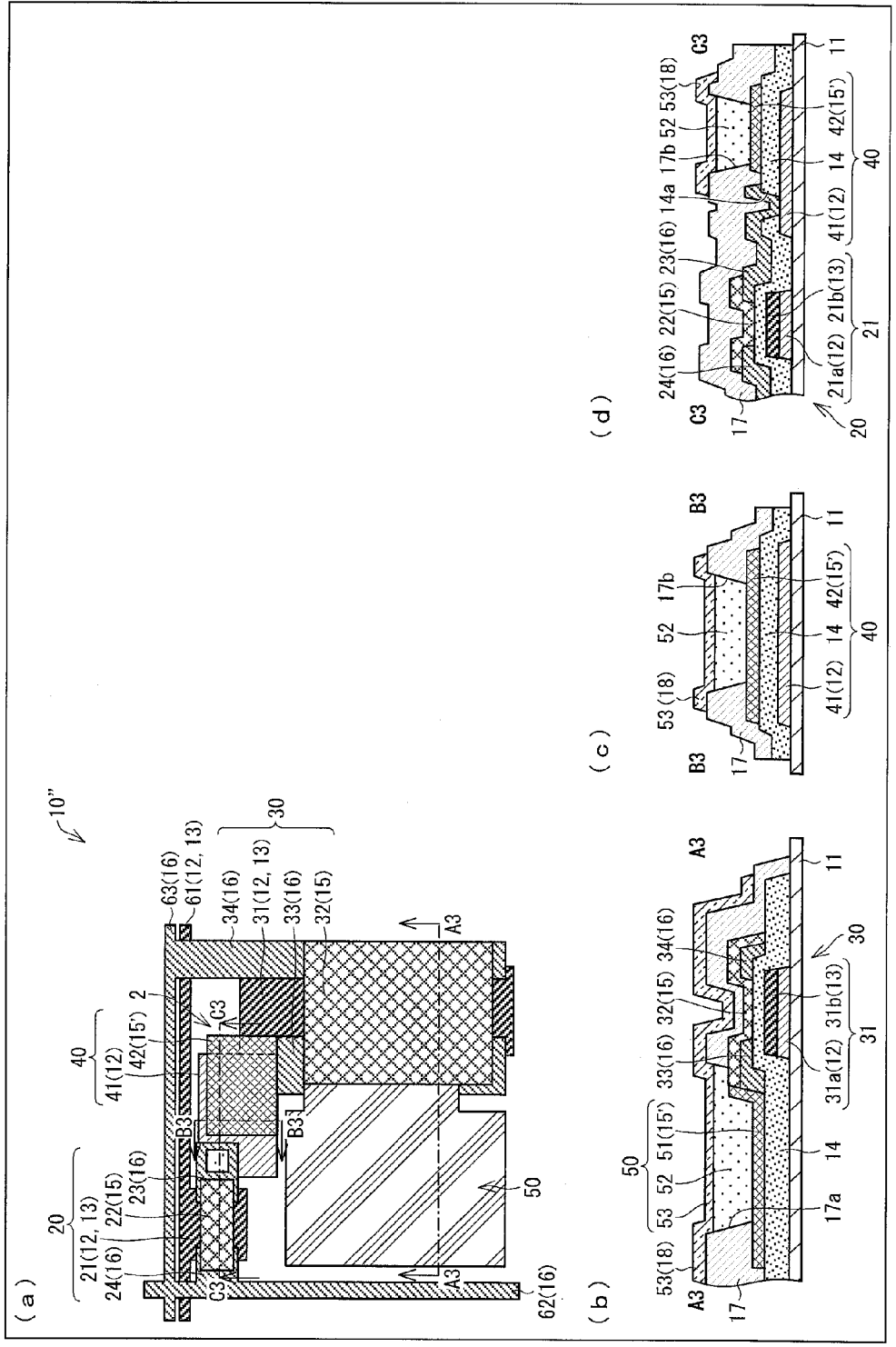
FIG. 12 is a view in which (a) is a plan view schematically illustrating a configuration of one pixel on an element substrate in Embodiment 3, (b) is a cross-sectional view illustrating the element substrate taken along the line A3-A3 in (a), (c) is a cross-sectional view illustrating the element substrate taken along the line B3-B3 in (a), and (d) is a cross-sectional view illustrating the element substrate taken along the line C3-C3 in (a).

(a) of FIG. 12 is a plan view schematically illustrating a configuration of one pixel on an element substrate 10 in the present embodiment, (b) of FIG. 12 is a cross-sectional view illustrating the element substrate 10 taken along the line A3-A3 in (a) of FIG. 12, (c) of FIG. 12 is a cross-sectional view illustrating the element substrate 10 taken along the line B3-B3 in (a) of FIG. 12, and (d) of FIG. 12 is a cross-sectional view illustrating the element substrate 10 taken along the line C3-C3 in (a) of FIG. 12. Note that, for convenience, some constituent elements are not illustrated also in (a) of FIG. 12, as with (a) of FIG. 1.

In Embodiment 1, the example has been described in which the TFTs 20 and 30 have the top contact structure in which the source electrodes 23 and 33 and the drain electrodes 24 and 34 are provided on the gate insulating film 14 via the semiconductor layers 22 and 32, respectively.

An organic EL display device 100 and an organic EL display panel 1 of Embodiment 3 are substantially identical with the organic EL display device 100 and the organic EL display panel 1 of Embodiment 1, respectively, except that (i) TFTs 20 and 30 have a bottom contact structure in which semiconductor layers 22 and 32 are provided on a gate insulating film 14 so as to cover source electrodes 23 and 33 and drain electrodes 24 and 34 and thus (ii) a pixel electrode 51 of an organic EL element 50 makes contact with a lateral surface of the source electrode 33 of the TFT 30 (see (a), (b), and (d) of FIG. 12).

<Method for Producing Organic EL Display Panel 1>

Figure 13:
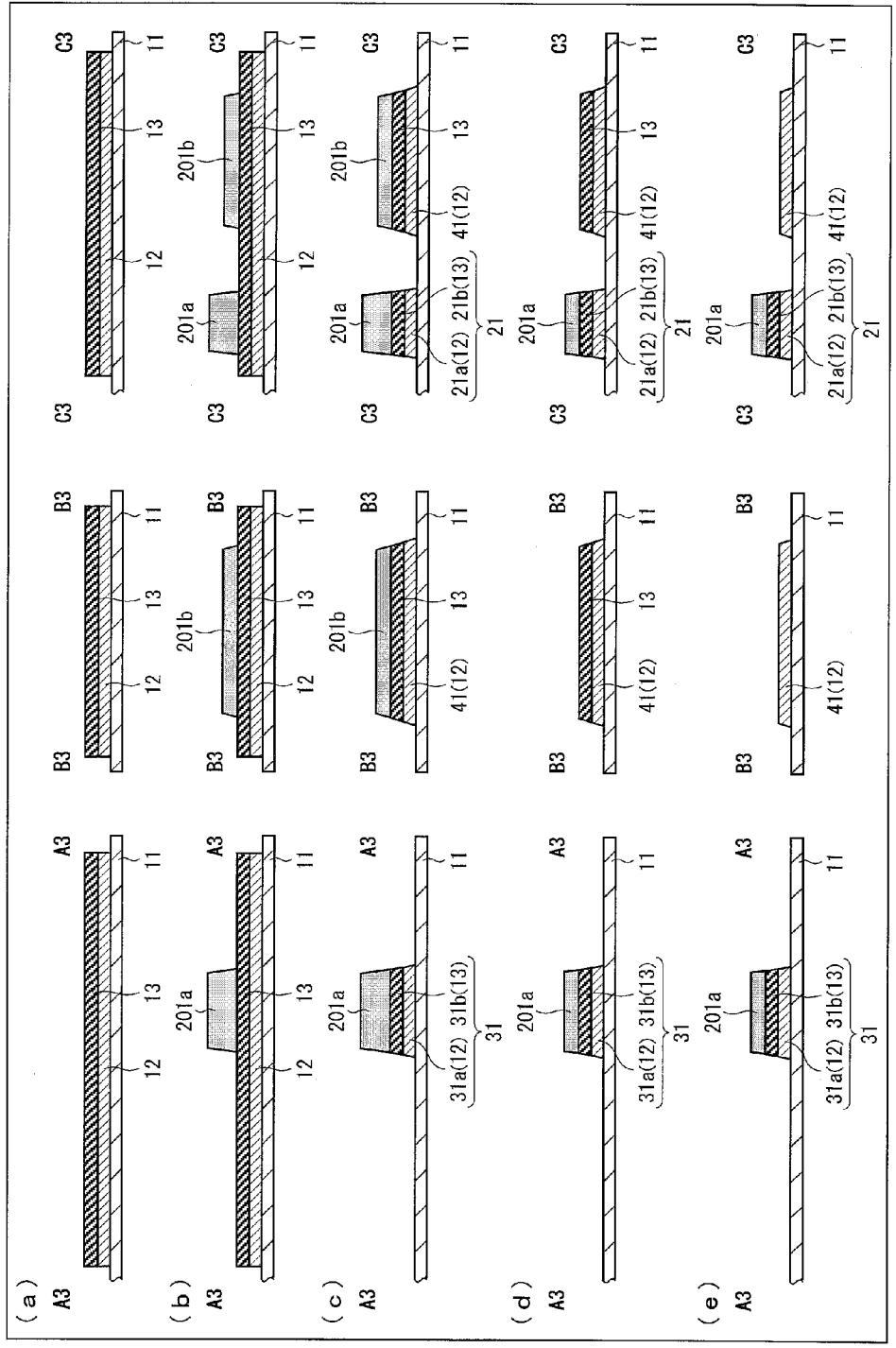
FIG. 13 is a cross-sectional view (i) taken along the lines A3-A3, B3-B3, and C3-C3 in (a) of FIG. 12 and (ii) illustrating an example of processes for producing the element substrate sequentially in (a) through (e).
Figure 14:
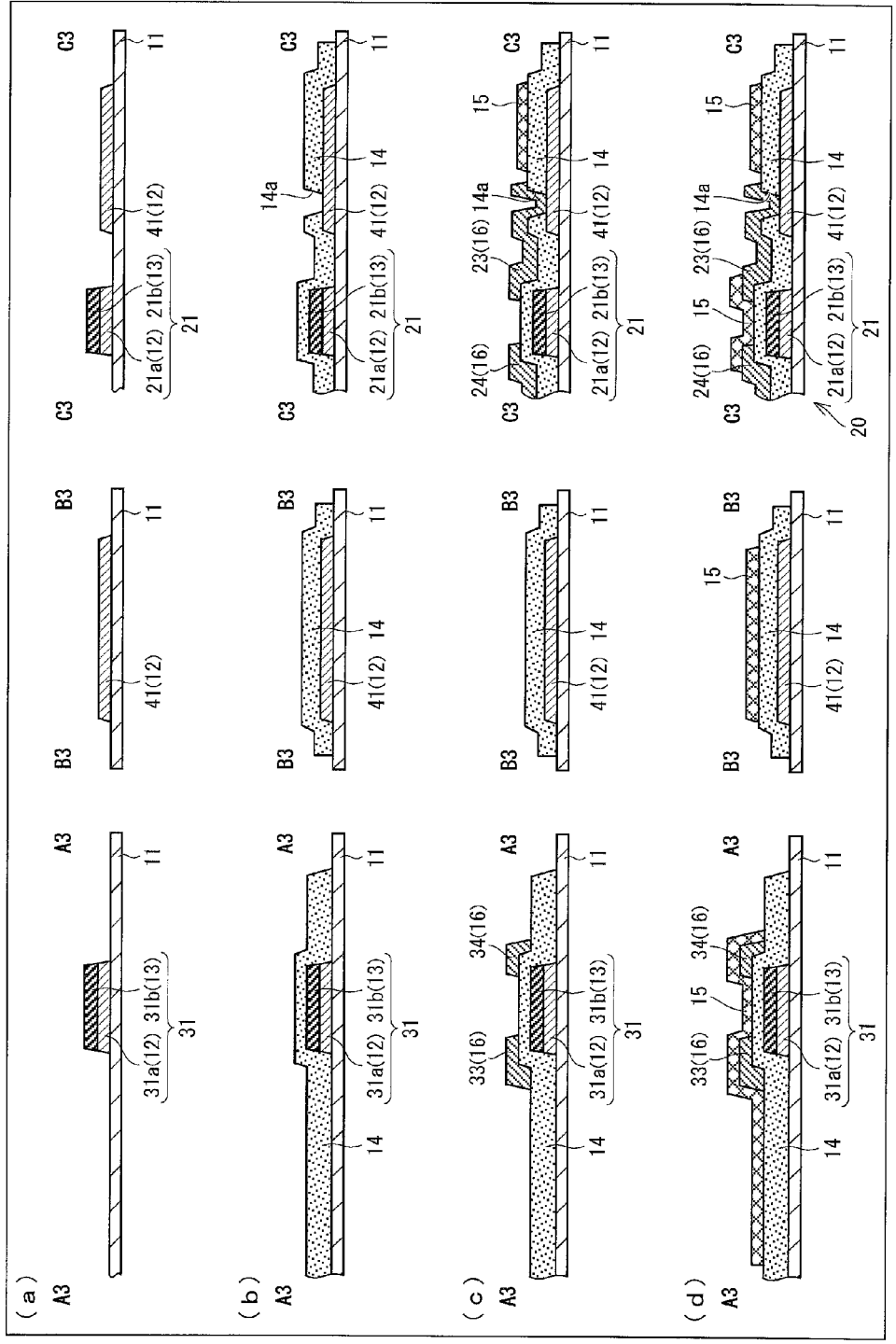
FIG. 14 is a cross-sectional view (i) taken along the lines A3-A3, B3-B3, and C3-C3 in (a) of FIG. 12 and (ii) illustrating an example of processes which are carried out for producing the element substrate sequentially in (a) through (d) after the processes illustrated in (a) through (e) of FIG. 13.
Figure 15:
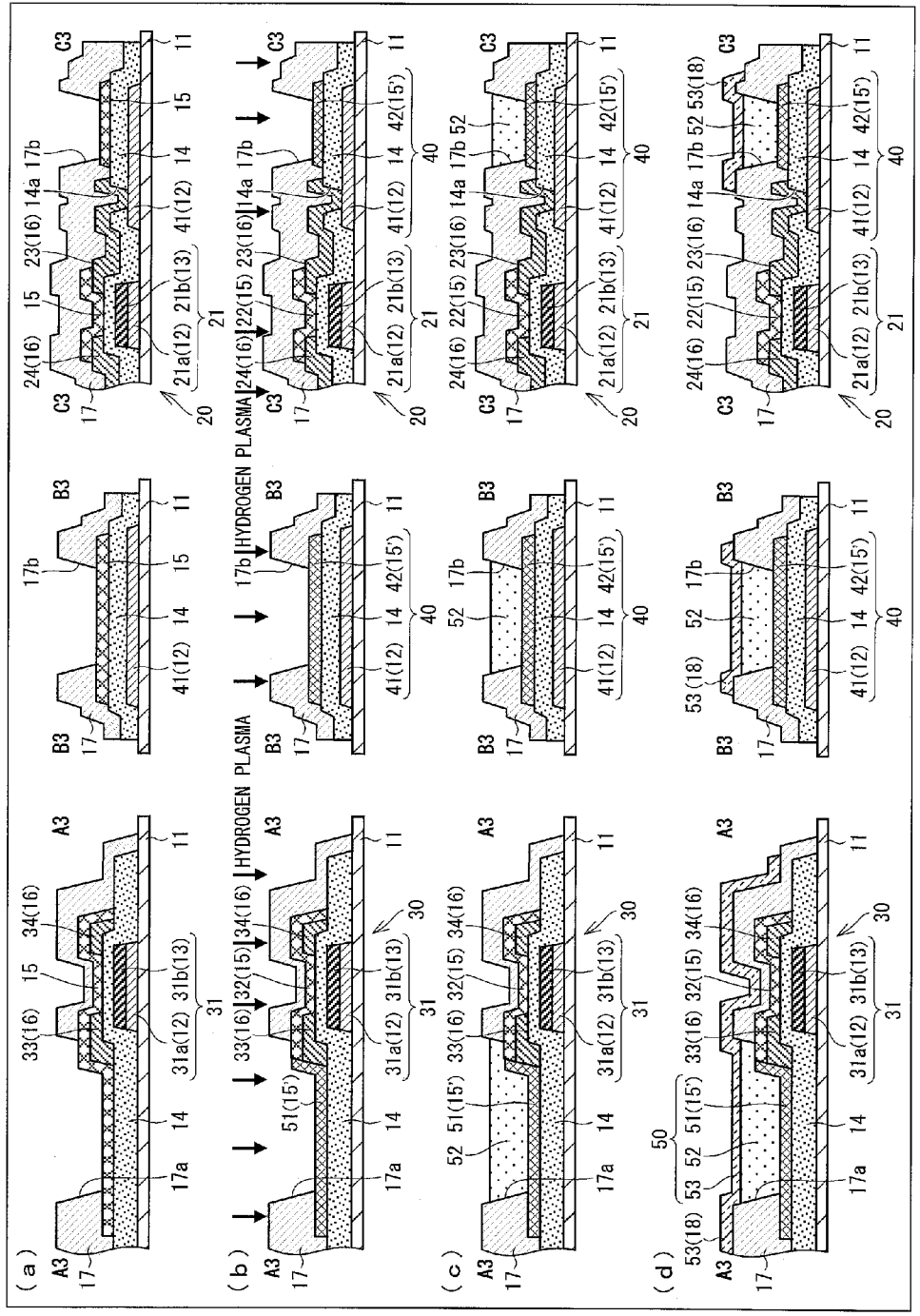
FIG. 15 is a cross-sectional view (i) taken along the lines A3-A3, B3-B3, and C3-C3 in (a) of FIG. 12 and (ii) illustrating an example of processes which are carried out for producing the element substrate sequentially in (a) through (d) after the processes illustrated in (a) through (d) of FIG. 14.

The following description will discuss a method for producing the organic EL display panel 1 of the present embodiment with reference to FIGS. 13 through 15. Note that thicknesses, materials, and the like of constituent elements described below merely exemplify an embodiment of the present invention, and therefore should not be construed as limiting the scope of the invention only to them.

FIGS. 13 through 15 are cross-sectional views taken along the lines A3-A3, B3-B3, and C3-C3 in (a) of FIG. 12 and sequentially illustrate an example of processes in the method for producing the element substrate 10. Note that the cross sections taken along the lines A3-A3, B3-B3, and C3-C3 in (a) of FIG. 12 respectively correspond to the cross sections taken along the lines A1-A1, B1-B1, and C1-C1 in (a) of FIG. 1.

(Step of Forming Source Electrode 33 and Drain Electrode 34)

In the present embodiment, processes illustrated in (a) through (e) of FIG. 13 and (a) and (b) of FIG. 14 are identical with those illustrated in (a) through (e) of FIG. 4 and (a) and (b) of FIG. 5. Therefore, descriptions of such processes are omitted here.

In the present embodiment, after a gate insulating film 14 is deposited as illustrated in (b) of FIG. 14, a metal layer 16 is deposited on the gate insulating film 14 so as to cover gate electrodes 21 and 31 of the TFTs 20 and 30, and then the metal layer 16 is shaped into an intended pattern by photolithography and dry etching with the use of a third photomask (not illustrated) as illustrated in (c) of FIG. 14. From this, source electrodes 23 and 33, drain electrodes 24 and 34, a source line 62, and a driving power source line 63 are formed from the metal layer 16, and the source electrode 23 is connected with a lower part electrode 41 of a Cs section 40 via an opening 14a.

Note that, in the present embodiment also, Ti, Al, and Ti having respective thicknesses of 50 nm, 200 nm, and 100 nm are deposited in this order as the source metal layer by a sputtering device, as with Embodiment 1. Thus, the source electrodes 23 and 33, the drain electrodes 24 and 34, the source line 62, and the driving power source line 63 are formed each of which has a three-layer structure of Ti/Al/Ti.

(Step of Forming Oxide Semiconductor Layer 15)

Next, on the gate insulating film 14, the oxide semiconductor layer 15 is deposited so as to cover the metal layer 16. Note that, in the present embodiment also, an a-InGaZnOx layer having a thickness of 50 nm is deposited as the oxide semiconductor layer 15 by the use of a sputtering device, as with Embodiment 1.

Subsequently, a photoresist (not illustrated) is stacked on the oxide semiconductor layer 15, and then the oxide semiconductor layer 15 is shaped into an intended pattern by photolithography and wet etching with the use of a fourth photomask (not illustrated) (see (d) of FIG. 14). Specifically, the oxide semiconductor layer 15 is patterned so as to correspond to a pixel electrode pattern of the organic EL element 50, a semiconductor pattern of the TFTs 20 and 30, and an upper part electrode pattern of the Cs section 40. From this, the oxide semiconductor layer 15 is provided on the gate insulating film 14 so as to cover the source electrode 23 and the drain electrode 24, and thus the TFT 20 is formed.

In this case, in the present embodiment also, the pixel electrode pattern of the organic EL element 50 is formed as a part extending from the semiconductor pattern of the TFT 30.

(Step of Forming Protective Film 17)

Next, a protective film 17 is deposited on an entire surface of the substrate, and then openings 17a and 17b are formed in the protective film 17 with the use of a fifth photomask (see (a) of FIG. 15). In this case, in the present embodiment, the opening 17a of the protective film 17 is formed such that an end part of the opening 17a overlaps with an end part of the source electrode 33 when viewed from above. From this, a surface of the oxide semiconductor layer 15 is exposed in a pixel electrode formation region of the organic EL element 50 and in an upper part electrode formation region of the Cs section 40.

Note that, in the present embodiment also, a $SiO_2$ film having a thickness of 200 nm is deposited as the protective film 17, as with Embodiment 1.

(Step of Reducing Oxide Semiconductor Layer 15)

Next, reduction is carried out over the protective film 17 so as to reduce a part of the oxide semiconductor layer 15 which part is not covered with the protective film 17 (see (b) of FIG. 15). From this, a reduced oxide semiconductor layer 15' is obtained which is the oxide semiconductor layer 15 thus reduced.

As such, in the present embodiment also, the pixel electrode 51 is formed integrally with the semiconductor layer 32 formed from the oxide semiconductor layer 15, and the TFT 30 is formed which includes, for example, the source electrode 33 that is directly connected with the pixel electrode 51.

Moreover, simultaneously, the upper part electrode 42 is formed from the reduced oxide semiconductor layer 15', and the Cs section 40 is formed in which the lower part electrode 41 formed from the transparent conductive layer 12 overlaps with the upper part electrode 42 via the gate insulating film 14.

Processes themselves illustrated in (c) and (d) of FIG. 15 are identical with those illustrated in (c) and (d) of FIG. 6. Therefore, descriptions of processes illustrated in (c) and (d) of FIG. 15 are omitted here.

<Effects>

Through the above processes, the organic EL display panel 1 is produced in which (i) the TFTs 20 and 30 have the bottom contact structure in which the oxide semiconductor layer 15 is provided on the gate insulating film 14 so as to cover the source electrodes 23 and 33 and the drain electrodes 24 and 34 and (ii) the pixel electrode 51 of the organic EL element 50 is making contact with the lateral surface of the source electrode 33.

As is clear from the above descriptions and FIGS. 12 through 15, in the present embodiment also, the semiconductor layer pattern of the TFTs 20 and 30 and the pattern of the pixel electrode 51 can be formed simultaneously with the use of one photomask, and the conductor obtained by reducing a part of the oxide semiconductor layer 15 is used as the transparent electrode. Therefore, in the present embodiment, it is of course possible to bring about the effects identical with those of Embodiment 1.

The following further describes effects unique to the present embodiment, with reference to comparative drawings.

Figure 16:
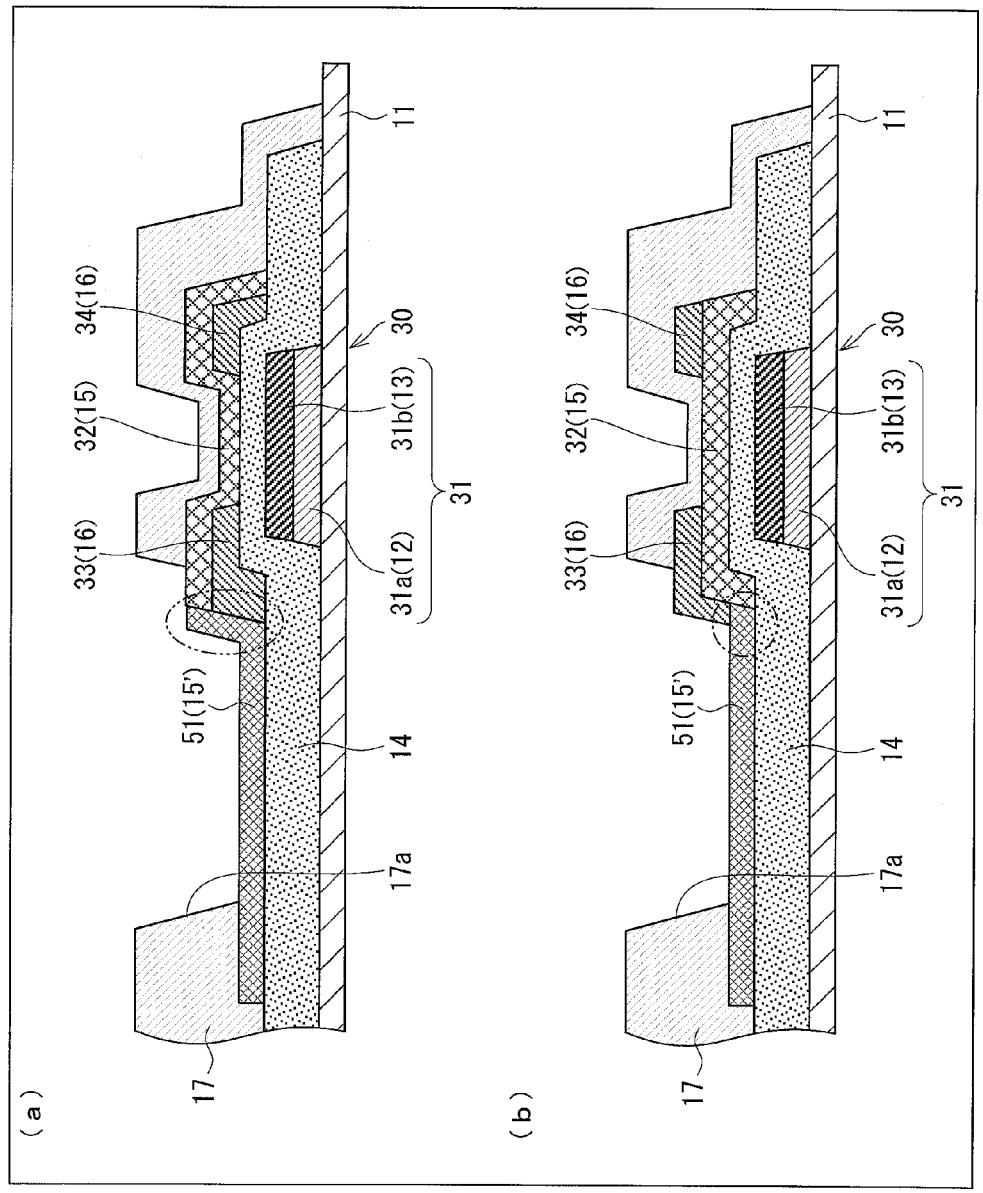
FIG. 16 is a view in which (a) is a cross-sectional view of the element substrate of Embodiment 3 taken along the line A3-A3 and (b) is a cross-sectional view of the element substrate of Embodiment 1 taken along the line A1-A1.

(a) of FIG. 16 is a cross-sectional view of the element substrate 10 of Embodiment 3 taken along the line A3-A3, and (b) of FIG. 16 is a cross-sectional view of the element substrate 10 of Embodiment 1 taken along the line A1-A1. In the descriptions below, comparison is made with reference to the cross section of the element substrate 10 taken along the line A3-A3 and the cross section of the element substrate 10 taken along the line A1-A1, as respectively illustrated in (a) and (b) of FIG. 16. Note, however, that the same explanation of course applies to the cross section of the element substrate 10 taken along the line C3-C3 and the cross-section of the element substrate 10 taken along the line C1-C1.

In a case where the TFTs 20 and 30 have the top contact structure as in Embodiment 1, a part (surrounded by the two-dot chain line in (b) of FIG. 16) under the metal layer 16 (source metal) in reduction may not be sufficiently reduced because the part is hidden behind the metal layer 16. If the reduction is not sufficiently carried out, the pixel electrode 51 may not sufficiently make contact with the metal layer 16. Similarly, in the cross section taken along the line C1-C1, the upper part electrode 42 of the Cs section 40 may not sufficiently make contact with the metal layer 16.

However, according to Embodiment 3, the pixel electrode 51 of the organic EL element 50 is making contact with the lateral surface of the source electrode 33 (as indicated by two-dot chain line in (a) of FIG. 16 which is the cross section taken along the line A3-A3), and this allows the reduction region of the oxide semiconductor layer 15 (i.e., the reduced oxide semiconductor layer 15') to sufficiently and surely make contact with the source electrode 33.

Modification Examples

The following description will discuss modification examples of Embodiments 1 through 3.

<Modification Example Relating to Patterning of Oxide Semiconductor Layer 15>

In Embodiments 1 through 3, the example has been described in which the pixel electrode pattern of the organic EL element 50 is formed as the part extending from the semiconductor pattern of the TFT 30.

However, the pixel electrode pattern of the organic EL element 50 does not necessarily need to be formed integrally with the semiconductor pattern of the TFT 30.

Figure 17:
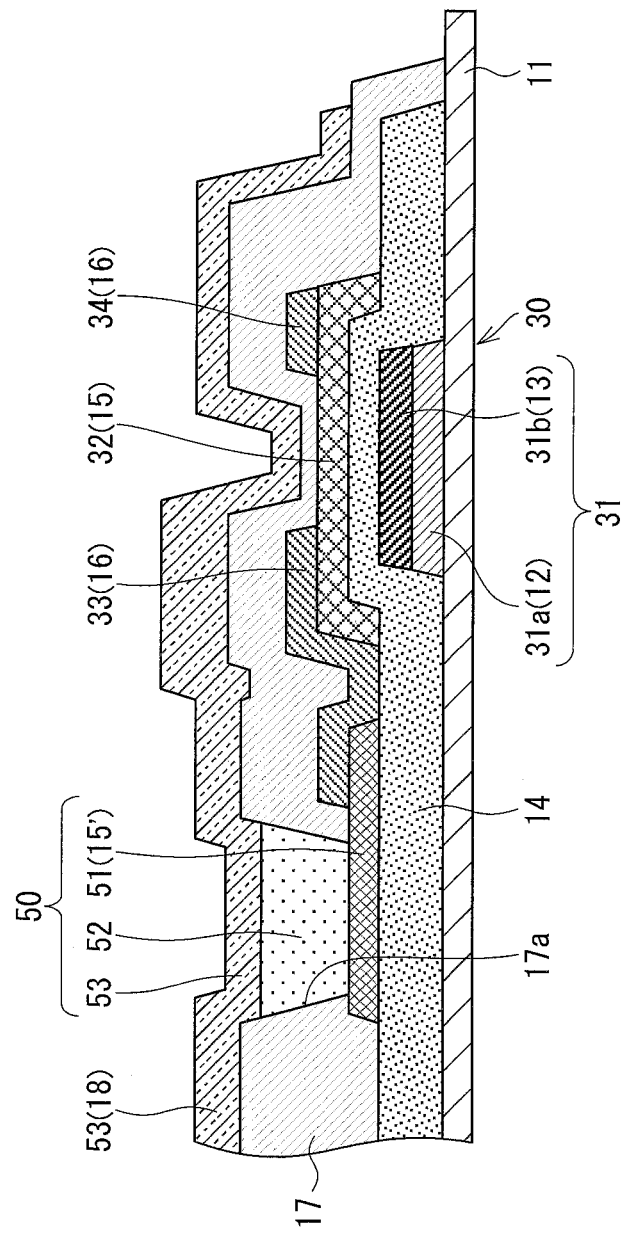
FIG. 17 is a cross-sectional view illustrating another example of the element substrate taken along the line A1-A1 in (a) of FIG. 1.
Figure 18:
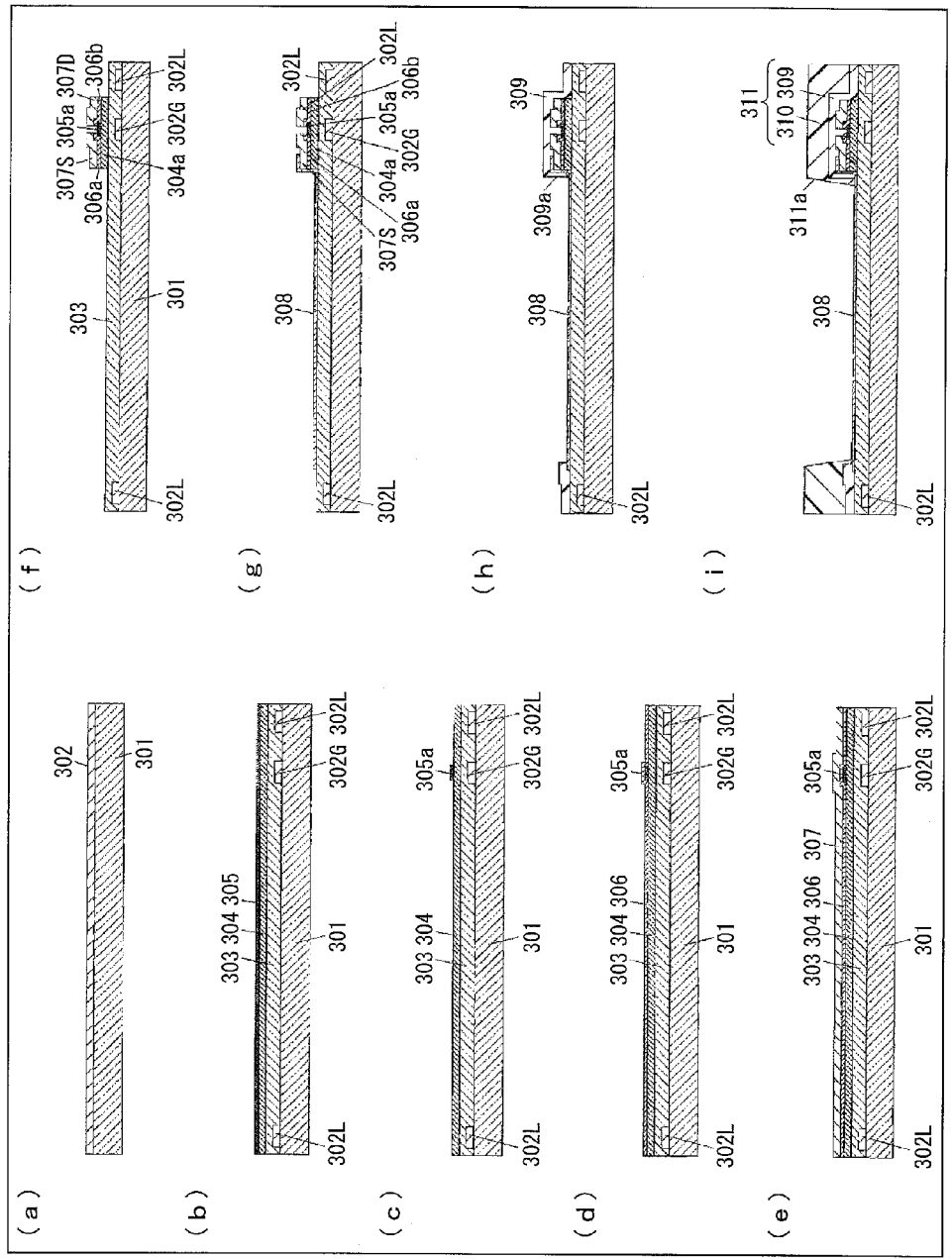
FIG. 18 is a cross-sectional view illustrating part of processes for producing, sequentially in (a) through (i), an organic EL display panel disclosed in Patent Literature 1.

FIG. 17 is a cross-sectional view illustrating another example of the element substrate 10 taken along the line A1-A1 in (a) of FIG. 1.

FIG. 17 illustrates an example in which the pixel electrode pattern of the organic EL element 50 is formed apart from the semiconductor pattern of the TFT 30.

Even in a case where the pixel electrode pattern of the organic EL element 50 is thus formed apart from the semiconductor pattern of the TFT 30, it is possible to bring about effects identical with those of Embodiment 1 by forming a pattern on the semiconductor pattern of the TFT 30 such that one of the source electrode 33 and the drain electrode 34 (e.g., source electrode 34) makes contact with an end part on an upper surface of the pixel electrode pattern of the organic EL element 50.

<Modification Example Relating to Method for Reducing Oxide Semiconductor Layer 15>

In Embodiments 1 through 3, the example has been described in which the hydrogen plasma treatment is carried out in order to reduce the oxide semiconductor layer 15. Note, however, that the method for reducing the oxide semiconductor layer 15 is not limited to this. Other than the hydrogen plasma treatment, for example, a method can be employed in which the oxide semiconductor layer 15 is doped with hydrogen ions or boron ions.

<Modification Example Relating to EL Element>

In Embodiments 1 through 3, the example has been described in which the organic EL element is used as the EL element.

Note, however, that the organic EL element and the inorganic EL element are different from each other only in material, and the element substrate 10 can of course be an inorganic EL substrate (inorganic EL element substrate) in which an inorganic EL element is provided instead of the organic EL element 50. That is, the EL substrate, the EL display panel, and the EL display device in Embodiments 1 through 3 can be an inorganic EL substrate, an inorganic EL display panel, and an inorganic EL display device, respectively.

[Main Points]

As above described, the electroluminescent substrate in accordance with an aspect of the present invention includes: a gate insulating film; a transistor; an electroluminescent element; a capacitor section; and a protective layer, a semiconductor layer of the transistor, a lower part electrode of the electroluminescent element, and an upper part electrode of the capacitor section being provided on the gate insulating film, and the protective layer being provided over the semiconductor layer, the lower part electrode, and the upper part electrode, the protective layer having an opening through which the lower part electrode and the upper part electrode are exposed, the semiconductor layer being an oxide semiconductor layer, and each of the lower part electrode and the upper part electrode being a reduction electrode which has been made by reducing the oxide semiconductor layer provided on the gate insulating film.

Specifically, the electroluminescent substrate includes (i) a transistor having a semiconductor layer provided on a gate electrode, which is formed on a semiconductor substrate, via a gate insulating film, (ii) an electroluminescent element which is provided on the gate insulating film and has (a) a first electrode which is a lower part electrode, (b) a luminescent layer provided on the first electrode, and (c) a second electrode which is an upper part electrode and is provided on the luminescent layer, (iii) a capacitor section in which a second capacitor electrode that is an upper part electrode is provided on a first capacitor electrode that is a lower part electrode via the gate insulating film, (iv) a protective layer provided over the semiconductor layer, the first electrode, and the second capacitor electrode, the protective layer having an opening via which the first electrode and the second capacitor electrode are exposed, the semiconductor layer being an oxide semiconductor layer, and each of the first electrode and the second capacitor electrode being a reduction electrode which is formed by reducing an oxide semiconductor layer formed on the gate insulating film.

The semiconductor layer of the transistor, the lower part electrode of the electroluminescent element, and the upper part electrode of the capacitor section are provided on the gate insulating film and are formed from the oxide semiconductor layer. It is therefore possible to simultaneously obtain, with the use of one photomask, the pattern of the semiconductor layer of the transistor, the lower part electrode of the electroluminescent element, and the upper part electrode of the capacitor section by patterning the oxide semiconductor layer. Further, by reducing the pattern corresponding to the lower part electrode of the electroluminescent element and the upper part electrode of the capacitor section while using the protective film as a mask, it is possible to form the lower part electrode of the electroluminescent element and the upper part electrode of the capacitor section from the reduction electrode of the oxide semiconductor layer.

The oxide semiconductor layer becomes a conductor by being reduced. Moreover, the reduced oxide semiconductor layer is transparent and does not absorb light having a wavelength in a visible light range, and therefore the lower part electrode of the electroluminescent element thus obtained can be used as an electrode of a light-emitting section for bottom emission.

Therefore, according to the configuration, even in a case where the electroluminescent substrate is a bottom emission type, (i) an ITO layer is not required as a transparent electrode in an electroluminescent element unlike a conventional technique, and (ii) it is possible to simultaneously form the pattern of the semiconductor layer of the transistor, the lower part electrode of the electroluminescent element, and the upper part electrode of the capacitor section with one photomask. This makes it possible to reduce a photomask by one, as compared with the conventional technique.

Moreover, according to the configuration, the conductor obtained by reducing a part of the oxide semiconductor layer is used as the transparent electrode as above described, and it is therefore possible to reduce the number of processes in production.

That is, the method in accordance with an aspect of the present invention for producing an electroluminescent substrate includes the steps of: (A) forming an oxide semiconductor layer on a gate insulating film; (B) shaping the oxide semiconductor layer into a pattern that corresponds to a semiconductor layer of a transistor, a lower part electrode of an electroluminescent element, and an upper part electrode of a capacitor section; (C) forming a protective film over the pattern of the oxide semiconductor layer, the protective film having an opening through which a part of the pattern, which part corresponds to the lower part electrode and the upper part electrode, is exposed; and (D) forming the lower part electrode and the upper part electrode, which are made of a reduction electrode of the oxide semiconductor layer, by reducing the part of the pattern, which part corresponds to the lower part electrode and the upper part electrode, while using the protective film as a mask.

Therefore, according to an aspect of the present invention, it is possible to provide the electroluminescent substrate and the method for producing the electroluminescent substrate which can reduce the number of processes and masks for production as compared with a conventional technique, even in the case of the bottom emission type as above described.

According to the electroluminescent substrate, it is preferable that a gate electrode of the transistor has a transparent conductive layer and a metal layer; and the transparent conductive layer and a lower part electrode of the capacitor section are provided on a same plane and are made of a same material.

According to the configuration, it is possible to simultaneously obtain the pattern of the gate electrode of the transistor and the lower part electrode of the capacitor section with the use of the same mask.

Further, according to the configuration, the lower part electrode and the upper part electrode of the capacitor section are made up of the transparent electrodes, and this allows light to pass through the capacitor section. Therefore, according to the configuration, the upper part electrode of the capacitor section can be used as the pixel electrode of the light-emitting section. From this, by forming (i) the luminescent layer on the upper part electrode of the capacitor section and (ii) the electrode, which faces the upper part electrode of the capacitor section, on the luminescent layer, it is possible to form the light-emitting section on the capacitor section. This makes it possible to (i) reduce the number of processes and the number of masks as compared with a conventional technique and (ii) improve an aperture ratio even in the bottom emission type.

Moreover, from this, the method preferably further includes the steps of: (E) stacking a transparent conductive layer and a metal layer on a substrate in this order; (F) forming (i) a gate electrode of the transistor from the transparent conductive layer and the metal layer and (ii) a lower part electrode of the capacitor section from the transparent conductive layer by (i) forming a photoresist on the metal layer, (ii) forming a photoresist pattern by carrying out half-tone exposure with respect to the photoresist, and then (iii) carrying out ashing and etching, the photoresist pattern being formed in a formation region of the gate electrode and in a formation region of the lower part electrode of the capacitor section and having a thickness which is greater in the formation region of the gate electrode than in the formation region of the lower part electrode of the capacitor section; and (G) forming a gate insulating film on the substrate so that the gate insulating film covers the gate electrode and the lower part electrode of the capacitor section, the steps (E), (F), and (G) being carried out before the step (A).

From this, it is possible to simultaneously obtain the pattern of the gate electrode of the transistor and the lower part electrode of the capacitor section with the use of the same mask.

In the electroluminescent substrate, it is preferable that an electrode, which is made of a material identical with that of an upper part electrode of the electroluminescent element, is provided on the upper part electrode of the capacitor section via a luminescent layer.

From this, the method for producing the electroluminescent substrate preferably further includes the steps of: (H) forming a luminescent layer on the lower part electrode of the electroluminescent element and the upper part electrode of the capacitor section; and (I) forming (i) a first electrode pattern that faces the lower part electrode of the electroluminescent element via the luminescent layer and (ii) a second electrode pattern that faces the upper part electrode of the capacitor section via the luminescent layer by stacking a transparent conductive film on the luminescent layer and patterning the transparent conductive film, the first electrode pattern serving as an upper part electrode of the electroluminescent element.

From this, the light-emitting section can be simultaneously formed on the capacitor section with the use of the material identical with that of the electroluminescent element. This makes it possible to (i) reduce the number of processes and the number of masks as compared with a conventional technique and (ii) improve an aperture ratio even in the bottom emission type.

Moreover, it is possible in the electroluminescent substrate that a gate electrode of the transistor and a lower part electrode of the capacitor section are respective metal layers which are provided on a same plane and are made of a same material.

That is, the method for producing the electroluminescent substrate can further includes the steps of (J) forming a metal layer on a substrate; (K) shaping the metal layer into a pattern that corresponds to a gate electrode of the transistor and a lower part electrode of the capacitor section; and (L) forming a gate insulating film on the substrate so that the gate insulating film covers the gate electrode and the lower part electrode of the capacitor section, the steps (J), (K), and (L) being carried out before the step (A).

In this case, as above described, light cannot pass through the capacitor section, and therefore the light-emitting section cannot be provided on the capacitor section. However, even in this case, it is possible to provide the electroluminescent substrate and the method for producing the electroluminescent substrate which can reduce the number of processes and the number of masks for production as compared with a conventional technique, even in the bottom emission type.

Moreover, as above described, it is unnecessary to carry out a half-tone process in this case, and it is therefore possible to further simplify processes for producing the electroluminescent substrate.

In the electroluminescent substrate, it is preferable that the lower part electrode of the electroluminescent element is integrated with the semiconductor layer of the transistor which is connected with the electroluminescent element.

This makes it possible to easily secure electrical connection between (i) the lower part electrode of the electroluminescent element and (ii) the source electrode and the drain electrode which are provided so as to contact with the semiconductor layer of the transistor.

In the electroluminescent substrate, it is preferable that the transistor has a top contact structure in which a source electrode and a drain electrode are provided on the semiconductor layer; and one of the source electrode and the drain electrode of the transistor, which is connected with the electroluminescent element, is making contact with an upper surface end of the lower part electrode of the electroluminescent element.

In this case, in the method for producing the electroluminescent substrate, it is preferable that, in the step (B), a pattern corresponding to the lower part electrode of the electroluminescent element and a pattern corresponding to the semiconductor layer of the transistor, which is connected with the electroluminescent element, are formed integrally; and the method further includes the step of (M) forming one of a source electrode and a drain electrode of the transistor, which is connected with the electroluminescent element, such that the one of the source electrode and the drain electrode covers an end of a part of the pattern of the oxide semiconductor layer which part corresponds to the lower part electrode of the electroluminescent element, the step (M) being carried out before the step (C).

From this, it is possible to obtain, without a special design, a configuration in which one of the source electrode and the drain electrode of the transistor connected to the electroluminescent element is in contact with the end part on an upper surface of the lower part electrode of the electroluminescent element, by merely reducing the pattern corresponding to the lower part electrode of the electroluminescent element exposed in the protective film.

Therefore, according to the configuration and the method, it is possible to easily secure electrical connection between (i) the lower part electrode of the electroluminescent element and (ii) the source electrode and the drain electrode which are provided so as to contact with the semiconductor layer of the transistor.

The method for producing the electroluminescent substrate can further include the steps of: (N) forming a pattern of a source electrode and a drain electrode on a part of the pattern of the oxide semiconductor layer, which part corresponds to the semiconductor layer of the transistor, such that one of the source electrode and the drain electrode makes contact with an upper surface end of a part of the pattern of the oxide semiconductor layer which part corresponds to the lower part electrode of the electroluminescent element, the step (N) being carried out before the step (C).

With the design, even in a case where the lower part electrode of the electroluminescent element is formed apart from the pattern corresponding to the semiconductor layer of the transistor which is connected to the electroluminescent element, it is possible to easily secure electrical connection between (i) the lower part electrode of the electroluminescent element and (ii) the source electrode and the drain electrode which are provided so as to contact with the semiconductor layer of the transistor which is connected to the electroluminescent element.

In the electroluminescent substrate, it is preferable that the transistor has a bottom contact structure in which the semiconductor layer is provided on the gate insulating film so as to cover a source electrode and a drain electrode; and the lower part electrode of the electroluminescent element is making contact with a lateral surface of one of the source electrode and the drain electrode of the transistor which is connected with the electroluminescent element.

From this, the method of producing the electroluminescent substrate preferably further includes the step of: (O) forming a pattern of a source electrode and a drain electrode on the gate insulating film, the step (O) being carried out before the step (A), in the step (A), the oxide semiconductor layer being formed on the gate insulating film so that the oxide semiconductor layer covers the source electrode and the drain electrode, in the step (B), a pattern corresponding to the lower part electrode of the electroluminescent element and a pattern corresponding to the semiconductor layer of the transistor, which is connected with the electroluminescent element, being formed integrally, and in the step (C), the protective film being formed such that, when viewed from above, an end part of the opening, through which a part of the pattern of the oxide semiconductor layer which part corresponds to the lower part electrode of the electroluminescent element is exposed, overlaps with an end part of one of the source electrode and the drain electrode which one is electrically connected with the lower part electrode of the electroluminescent element.

In this case, it is possible to cause the reduction region of the oxide semiconductor layer (i.e., the reduced oxide semiconductor layer) to sufficiently and surely make contact with the source electrode or the drain electrode.

Moreover, each of the electroluminescent display panel and the electroluminescent display device in accordance with an aspect of the present invention includes the electroluminescent substrate in accordance with an aspect of the present invention. This makes it possible to reduce the number of processes and the number of masks for production as compared with a conventional technique, even in the bottom emission type, as above described.

The present invention is not limited to the embodiments, but can be altered by a skilled person in the art within the scope of the claims. An embodiment derived from a proper combination of technical means disclosed in respective different embodiments is also encompassed in the technical scope of the present invention.

INDUSTRIAL APPLICABILITY

The present invention is applicable to (i) an electroluminescent substrate, an electroluminescent display panel, and an electroluminescent display device each of which includes an organic or inorganic electroluminescent element, a capacitor section, and a transistor that is electrically connected with the electroluminescent element and the capacitor section and (ii) methods for producing the electroluminescent substrate, the electroluminescent display panel, and the electroluminescent display device.

REFERENCE SIGNS LIST

1: Organic EL display panel (electroluminescent display panel)
2: Pixel
10: Element substrate (electroluminescent substrate)
11: Insulating substrate
12: Transparent conductive layer
13: Metal layer
14: Gate insulating film
15: Oxide semiconductor layer
15': Reduced oxide semiconductor layer
16: Metal layer
17: Protective film
17a, 17b: Opening
18: Conductive layer
20, 30: TFT
21, 31: Gate electrode
21a, 31a: Transparent conductive layer
21b, 31b: Metal layer
22, 32: Semiconductor layer
23, 33: Source electrode
24, 34: Drain electrode
40: Cs section (capacitor section)
41: Lower part electrode
42: Upper part electrode
50: Organic EL element (electroluminescent element)
51: Pixel electrode (lower part electrode of electroluminescent element)
52: Organic EL layer (luminescent layer)
53: Counter electrode (upper part electrode of electroluminescent element, electrode)
61: Gate line
62: Source line
63: Driving power source line
70: Counter substrate 81: Sealing material
82: Filler
83: Electrical wiring terminal
100: Organic EL display device (electroluminescent device)
101: Pixel section
102: Circuit section
103: Connection terminal
201a, 201b: Resist pattern
211: Semiconductor layer
212: Pixel electrode

The invention claimed is:

1. An electroluminescent substrate comprising:
a gate insulating film;
a transistor;
an electroluminescent element;
a capacitor section; and
a protective layer,
a semiconductor layer of the transistor, a lower part electrode of the electroluminescent element, and an upper part electrode of the capacitor section being provided on the gate insulating film, a source electrode of the transistor contacts and overlaps an interface between the semiconductor layer and the lower part electrode, and the protective layer being provided over the semiconductor layer, the lower part electrode, and the upper part electrode,
the protective layer having an opening through which the lower part electrode and the upper part electrode are exposed,
the semiconductor layer being an oxide semiconductor layer, and
each of the lower part electrode and the upper part electrode being a reduction electrode which has been made by reducing the oxide semiconductor layer provided on the gate insulating film.

2. The electroluminescent substrate as set forth in claim 1, wherein:
a gate electrode of the transistor has a transparent conductive layer and a metal layer; and
the transparent conductive layer and a lower part electrode of the capacitor section are provided on a same plane and are made of a same material.

3. The electroluminescent substrate as set forth in claim 2, wherein:
an electrode, which is made of a material identical with that of an upper part electrode of the electroluminescent element, is provided on the upper part electrode of the capacitor section via a luminescent layer.

4. The electroluminescent substrate as set forth in claim 1, wherein:
a gate electrode of the transistor and a lower part electrode of the capacitor section are respective metal layers which are provided on a same plane and are made of a same material.

5. The electroluminescent substrate as set forth in claim 1, wherein:
the lower part electrode of the electroluminescent element is integrated with the semiconductor layer of the transistor which is connected with the electroluminescent element.

6. The electroluminescent substrate as set forth in claim 1, wherein:
the transistor has a top contact structure in which the source electrode and a drain electrode are provided on the semiconductor layer; and
one of the source electrode and the drain electrode of the transistor, which is connected with the electroluminescent element, is making contact with an upper surface end of the lower part electrode of the electroluminescent element.

7. An electroluminescent display panel comprising an electroluminescent substrate recited in claim 1.

8. An electroluminescent display device comprising an electroluminescent substrate recited in claim 1.

9. A method for producing an electroluminescent substrate, said method comprising the steps of:
(A) forming an oxide semiconductor layer on a gate insulating film;
(B) shaping the oxide semiconductor layer into a pattern that corresponds to a semiconductor layer of a transistor, a lower part electrode of an electroluminescent element, and an upper part electrode of a capacitor section, wherein a source electrode of the transistor contacts and overlaps an interface between the semiconductor layer and the lower part electrode;
(C) forming a protective film over the pattern of the oxide semiconductor layer, the protective film having an opening through which a part of the pattern, which part corresponds to the lower part electrode and the upper part electrode, is exposed; and
(D) forming the lower part electrode and the upper part electrode, which are made of a reduction electrode of the oxide semiconductor layer, by reducing the part of the pattern, which part corresponds to the lower part electrode and the upper part electrode, while using the protective film as a mask.

10. The method as set forth in claim 9, further comprising the steps of:
(E) stacking a transparent conductive layer and a metal layer on a substrate in this order;
(F) forming (i) a gate electrode of the transistor from the transparent conductive layer and the metal layer and (ii) a lower part electrode of the capacitor section from the transparent conductive layer by (i) forming a photoresist on the metal layer, (ii) forming a photoresist pattern by carrying out half-tone exposure with respect to the photoresist, and then (iii) carrying out ashing and etching, the photoresist pattern being formed in a formation region of the gate electrode and in a formation region of the lower part electrode of the capacitor section and having a thickness which is greater in the formation region of the gate electrode than in the formation region of the lower part electrode of the capacitor section; and
(G) forming a gate insulating film on the substrate so that the gate insulating film covers the gate electrode and the lower part electrode of the capacitor section,
the steps (E), (F), and (G) being carried out before the step (A).

11. The method as set forth in claim 10, further comprising the steps of:
(H) forming a luminescent layer on the lower part electrode of the electroluminescent element and the upper part electrode of the capacitor section; and
(I) forming (i) a first electrode pattern that faces the lower part electrode of the electroluminescent element via the luminescent layer and (ii) a second electrode pattern that faces the upper part electrode of the capacitor section via the luminescent layer by stacking a transparent conductive film on the luminescent layer and patterning the transparent conductive film, the first electrode pattern serving as an upper part electrode of the electroluminescent element.

12. The method as set forth in claim 9, further comprising the steps of:
- (J) forming a metal layer on a substrate;
- (K) shaping the metal layer into a pattern that corresponds to a gate electrode of the transistor and a lower part electrode of the capacitor section; and
- (L) forming a gate insulating film on the substrate so that the gate insulating film covers the gate electrode and the lower part electrode of the capacitor section,
  the steps (J), (K), and (L) being carried out before the step (A).

13. The method as set forth in claim 9, wherein:
in the step (B), a pattern corresponding to the lower part electrode of the electroluminescent element and a pattern corresponding to the semiconductor layer of the transistor, which is connected with the electroluminescent element, are formed integrally; and
said method further comprises the step of (M) forming one of the source electrode and a drain electrode of the transistor, which is connected with the electroluminescent element, such that the one of the source electrode and the drain electrode covers an end of a part of the pattern of the oxide semiconductor layer which part corresponds to the lower part electrode of the electroluminescent element, the step (M) being carried out before the step (C).

14. The method as set forth in claim 9, further comprising the step of: (N) forming a pattern of the source electrode and a drain electrode on a part of the pattern of the oxide semiconductor layer, which part corresponds to the semiconductor layer of the transistor, such that one of the source electrode and the drain electrode makes contact with an upper surface end of a part of the pattern of the oxide semiconductor layer which part corresponds to the lower part electrode of the electroluminescent element, the step (N) being carried out before the step (C).

* * * * *